United States Patent
Fukuta et al.

(10) Patent No.: US 8,884,660 B2
(45) Date of Patent: Nov. 11, 2014

(54) DRIVER FOR SWITCHING ELEMENT AND CONTROL SYSTEM FOR MACHINE USING THE SAME

(71) Applicant: Denso Corporation, Kariya (JP)

(72) Inventors: Junichi Fukuta, Kuwana (JP);
Kazunori Watanabe, Kariya (JP);
Tsuneo Maebara, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 14/056,039

(22) Filed: Oct. 17, 2013

(65) Prior Publication Data

US 2014/0111253 A1   Apr. 24, 2014

(30) Foreign Application Priority Data

Oct. 18, 2012   (JP) ................................. 2012-230938

(51) Int. Cl.
*H03K 3/01* (2006.01)
*H03K 17/00* (2006.01)

(52) U.S. Cl.
CPC . *H03K 3/01* (2013.01); *H03K 17/00* (2013.01)
USPC ............ 327/109; 327/313; 327/389; 327/407

(58) Field of Classification Search
CPC combination set(s) only.
See application file for complete search history.

(56) References Cited

U.S. PATENT DOCUMENTS

| 8,350,601 B2 * | 1/2013 | Nagata et al. ................. 327/109 |
| 8,680,897 B2 * | 3/2014 | Itou et al. ...................... 327/109 |
| 8,704,556 B2 * | 4/2014 | Hamanaka et al. ........... 327/109 |
| 2011/0175650 A1 * | 7/2011 | Tumminaro et al. .......... 327/109 |

FOREIGN PATENT DOCUMENTS

| JP | 03-040517 | 2/1991 |
| JP | 2006-074937 | 3/2006 |

* cited by examiner

*Primary Examiner* — An Luu
(74) *Attorney, Agent, or Firm* — Nixon & Vanderhye PC

(57) ABSTRACT

In a driver, a charging module electrically charges the on-off control terminal of the switching element for turning on the switching element, and a limiting module performs a task of limiting a voltage at the on-off control terminal of the switching element by a predetermined voltage to thereby limit an increase of a current flowing between the input and output terminals of the switching element. A determining module determines whether the voltage at the on-off control terminal of the switching element deviates from the predetermined voltage while the limiting module is performing the limiting task. A correcting module corrects the voltage at the on-off control terminal of the switching element to be close to the predetermined voltage when it is determined that the voltage at the on-off control terminal of the switching element deviates from the predetermined voltage.

15 Claims, 19 Drawing Sheets

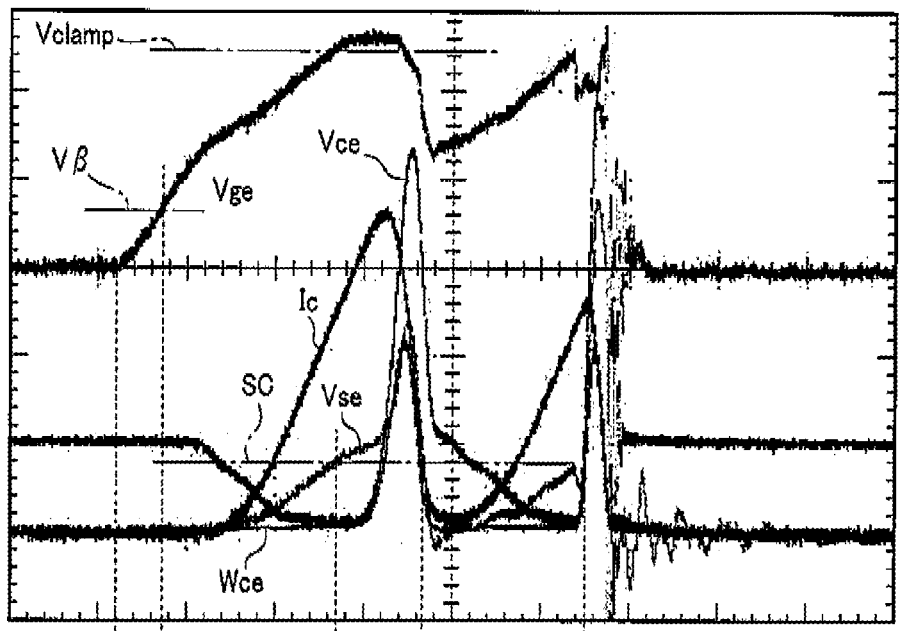

SW40
(CLAMPING)

SW38
(DISCHARGING)

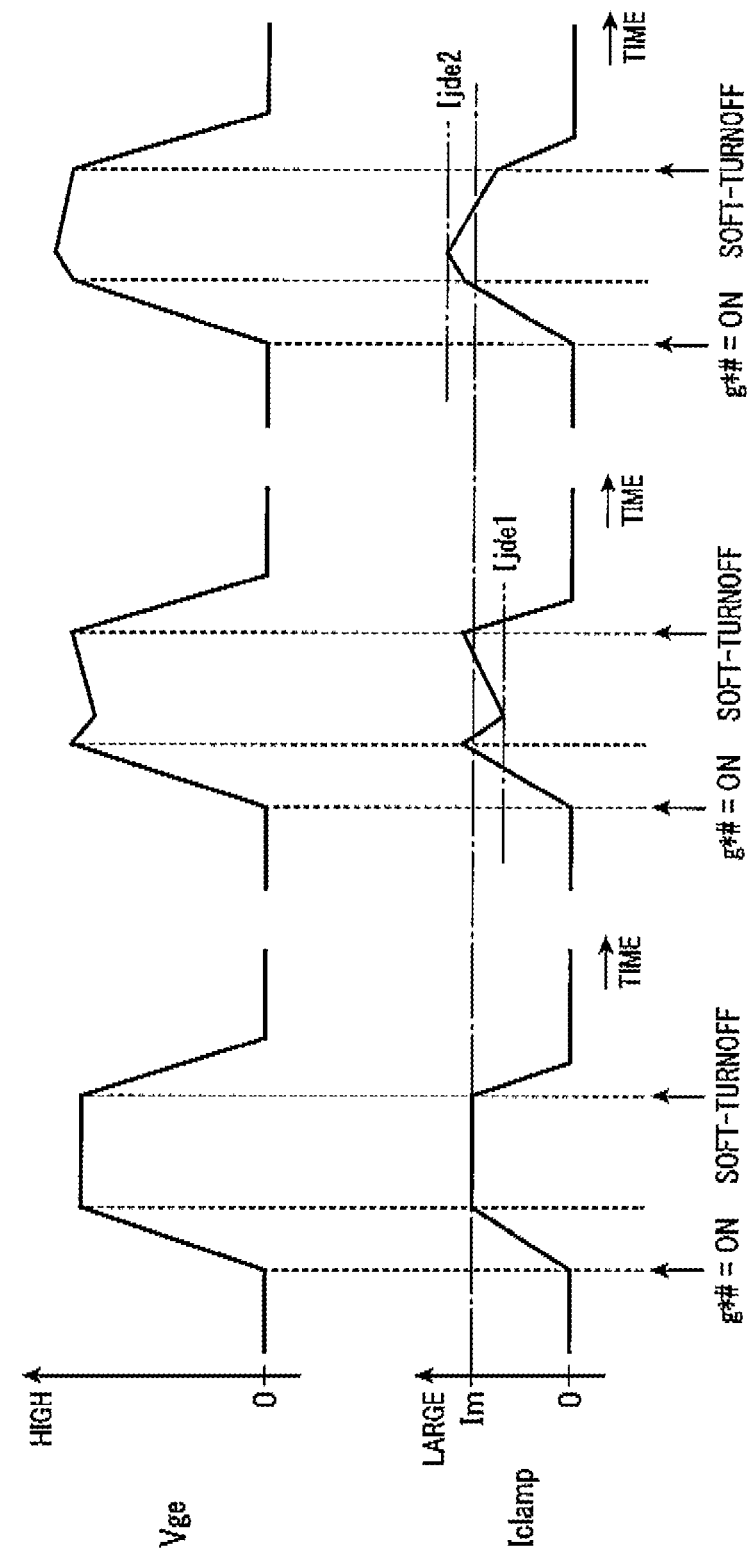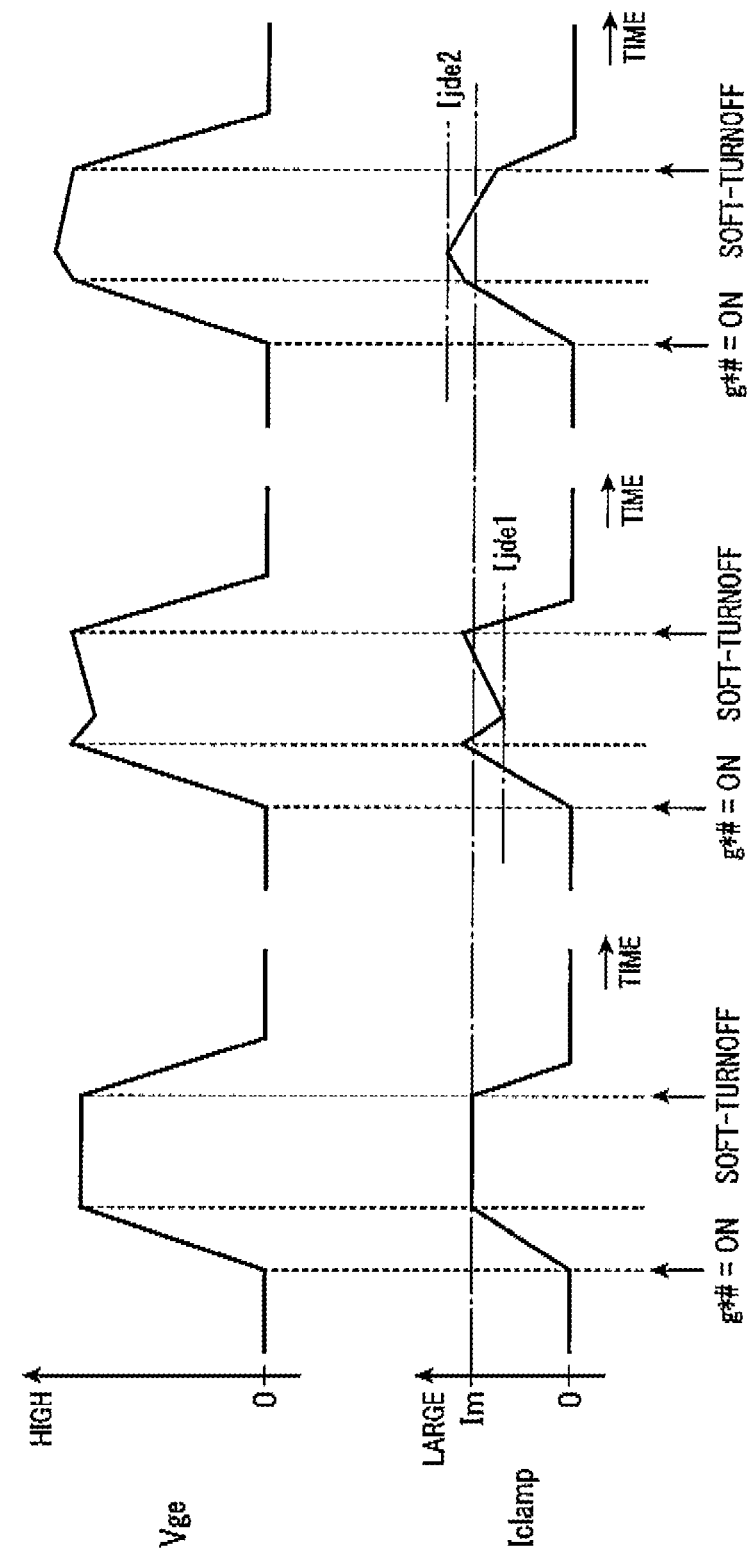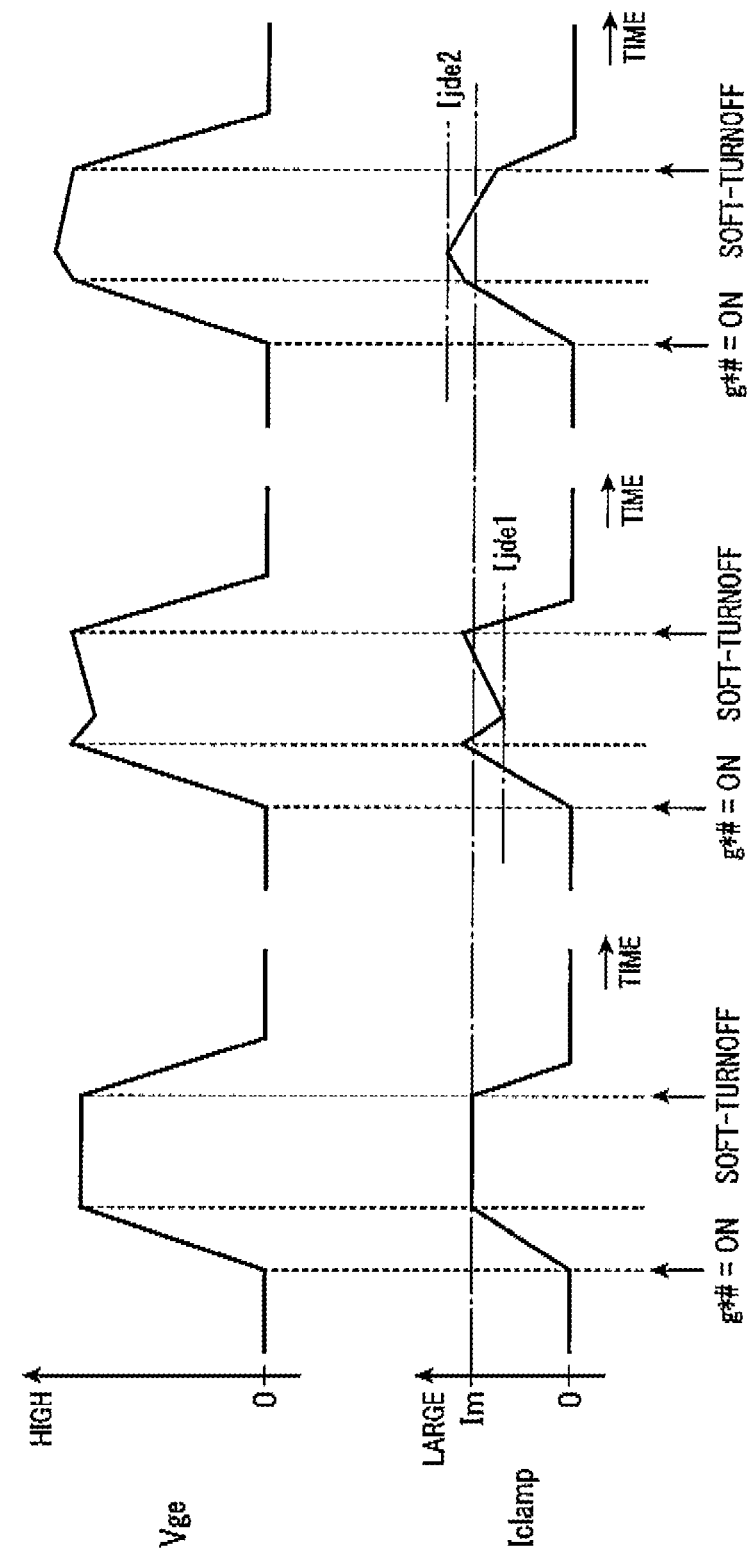

DRIVER FOR SWITCHING ELEMENT AND CONTROL SYSTEM FOR MACHINE USING THE SAME

CROSS REFERENCE TO RELATED APPLICATIONS

This application is based on and claims the benefit of priority from Japanese Patent Application 2012-230938 filed on Oct. 18, 2012, the disclosure of which is incorporated in its entirety herein by reference.

TECHNICAL FIELD

The present disclosure relates to drivers for driving a switching element.

BACKGROUND

Technologies for protecting an IGBT, as an example of semiconductor switching elements, against an overcurrent are known, one of which is disclosed in Japanese Patent Application Publication No. H3-40517. Specifically, the technology disclosed in the Patent Publication performs a clamping task while the IGBT is in an on state. The clamp task is configured to clamp the voltage at the gate, i.e. the open-close control terminal, of the IGBT to a predetermined voltage or thereabout when it is determined that the level of a collector current flowing through an electrical path between the collector and emitter, i.e. the input and output terminals, of the IGBT exceeds a predetermined threshold level. This aims to limit an increase of the level of the collector current. The threshold level for the collector current is previously determined such that, if the level of the collector current exceeds the threshold level, it is possible to surely determine that a short-circuit fault has occurred in the IGBT. The technology forcibly turns off the IGBT after a predetermined time has elapsed since the level of the collector current exceeded the threshold level.

SUMMARY

The inventors of this application have found that the voltage at the gate of the IGBT may deviate from the predetermined voltage although the clamp task is being performed, resulting in a situation where the IGBT may not be reliably protected against an overcurrent.

Specifically, let us consider a situation where an overcurrent flows through the conductive path between the collector and emitter of the IGBT. In this situation, there may be magnetic coupling between a floating inductance existing in a collector-current input path passing through the conductive path between the collector and emitter of the IGBT and that existing in a current conductive path connected to the gate of the IGBT for discharging the gate thereof. The magnetic coupling may transfer electrical charges, i.e. positive charges, stored in the gate of the IGBT therethrough to the current conductive path connected to the gate of the IGBT, causing the voltage at the gate of the IGBT, i.e. the gate voltage, to drop to deviate from the predetermined voltage. This negative deviation of the gate voltage from the predetermined voltage may cause the level of the collector current flowing through the conductive path between the collector and emitter of the IGBT to decrease to be equal to or lower than the threshold level. This may cause cancellation of the clamp task limiting an increase of the gate voltage over the predetermined voltage. This may cause the collector current with a level higher than the threshold level to flow as an overcurrent, resulting in reduction of the reliability of the IGBT.

If magnetic coupling is generated between a floating inductance existing in the collector-current input path passing through the conductive path between the collector and emitter of the IGBT and that existing in an electrical path connected to the gate of the IGBT for charging the gate thereof, the gate voltage may grow, so that the gate voltage may deviate from the predetermined voltage. This positive deviation of the gate voltage from the predetermined voltage may make it difficult for the clamp task to immediately limit an increase of the gate voltage, i.e. to immediately limit an increase of the level of the collector current, resulting in reduction of the reliability of the IGBT.

Deviation of the gate voltage of the IGBT from the predetermined voltage while the clamping task is being performed may take place due to other causes, which also result in reduction of the reliability of the IGBT.

In view of the circumstances set forth above, one aspect of the present disclosure seeks to provide drivers for a switching element, which are designed to address the problems set forth above.

Specifically, an alternative aspect of the present disclosure aims to provide such drivers, which are capable of reliably protecting the switching element against overcurrent even if it is determined that a voltage at a control terminal of the switching element, which is controlled to be clamped to a predetermined voltage, deviates from the predetermined voltage.

According to a first exemplary aspect of the present disclosure, there is provided a driver for driving a switching element having an input terminal, an output terminal, and an on-off control terminal. The driver includes a charging module configured to charge the on-off control terminal of the switching element for turning on the switching element, and a limiting module configured to perform a task of limiting a voltage at the on-off control terminal of the switching element by a predetermined voltage to thereby limit an increase of a current flowing between the input and output terminals of the switching element. The driver includes a determining module configured to determine whether the voltage at the on-off control terminal of the switching element deviates from the predetermined voltage while the limiting module is performing the limiting task. The driver includes a correcting module configured to correct the voltage at the on-off control terminal of the switching element to be close to the predetermined voltage when it is determined that the voltage at the on-off control terminal of the switching element deviates from the predetermined voltage.

According to a second exemplary aspect of the present disclosure, there is provided a control system for controlling a machine. The control system includes an inverter equipped with a pair of upper- and lower-arm switching elements connected in series. Each of the upper- and lower-arm switching elements has an input terminal, an output terminal, and an on-off control terminal. The control system includes a driver for driving each of the upper- and lower-arm switching elements to thereby invert a DC voltage inputted to the inverter into an AC voltage to be supplied to the machine. The driver includes a charging module configured to charge the on-off control terminal of a corresponding one of the upper- and lower switching elements for turning on the corresponding one of the upper- and lower switching elements. The driver includes a limiting module configured to perform a task of limiting a voltage at the on-off control terminal of a corresponding one of the upper- and lower switching elements by a predetermined voltage to thereby limit an increase of a current flowing between the input and output terminals of a corresponding one of the upper- and lower switching elements. The driver includes a determining module configured to determine whether the voltage at the on-off control terminal of a corresponding one of the upper- and lower switching elements deviates from the predetermined voltage while the limiting module is performing the limiting task. The driver includes a correcting module configured to correct the voltage at the on-off control terminal of a corresponding one of the upper- and lower switching elements to be close to the predetermined voltage when it is determined that the voltage at the on-off control terminal of a corresponding one of the upper- and lower switching elements deviates from the predetermined voltage In each of the first and second exemplary aspects, there may be magnetic coupling between a floating inductance existing in a conductive path between the input and output terminals of a corresponding switching element and that existing in a conductive path connected to the on-off control terminal of the switching element. This magnetic coupling may cause electrical charge to be transferred from/to the on-off control terminal of the low-side switching element, resulting in deviation of the voltage at the on-off control terminal of the switching element from the predetermined voltage even if the limiting module is performing the limiting task.

At that time, the determining module is configured to determine the deviation of the voltage at the on-off control terminal of the switching element from the predetermined voltage, and the correcting module corrects the voltage at the on-off control terminal of the switching element to be close to the predetermined voltage. This prevents abnormal behavior of the voltage at the on-off control terminal of the switching element while the limiting module is performing the limiting task, thus reliably protecting the switching element against an overcurrent due to abnormal behavior.

The above and/or other features, and/or advantages of various aspects of the present disclosure will be further appreciated in view of the following description in conjunction with the accompanying drawings. Various aspects of the present disclosure can include and/or exclude different features, and/or advantages where applicable. In addition, various aspects of the present disclosure can combine one or more feature of other embodiments where applicable. The descriptions of features, and/or advantages of particular embodiments should not be construed as limiting other embodiments or the claims.

BRIEF DESCRIPTION OF THE DRAWINGS

Other aspects of the present disclosure will become apparent from the following description of embodiments with reference to the accompanying drawings in which:

FIGS. 4A to 4E are a joint timing chart schematically illustrating an example of specific operations of the overcurrent protection task if there is a problem that the overcurrent protection task cannot turn off the switching element;

FIGS. 16A to 16C are a joint timing chart, each of which schematically illustrates an example of how the gate voltage and a clamp current of the switching element vary while a short-circuit current is flowing through the switching element according to a sixth embodiment of the present disclosure;

DETAILED DESCRIPTION OF EMBODIMENT

Figure 1:
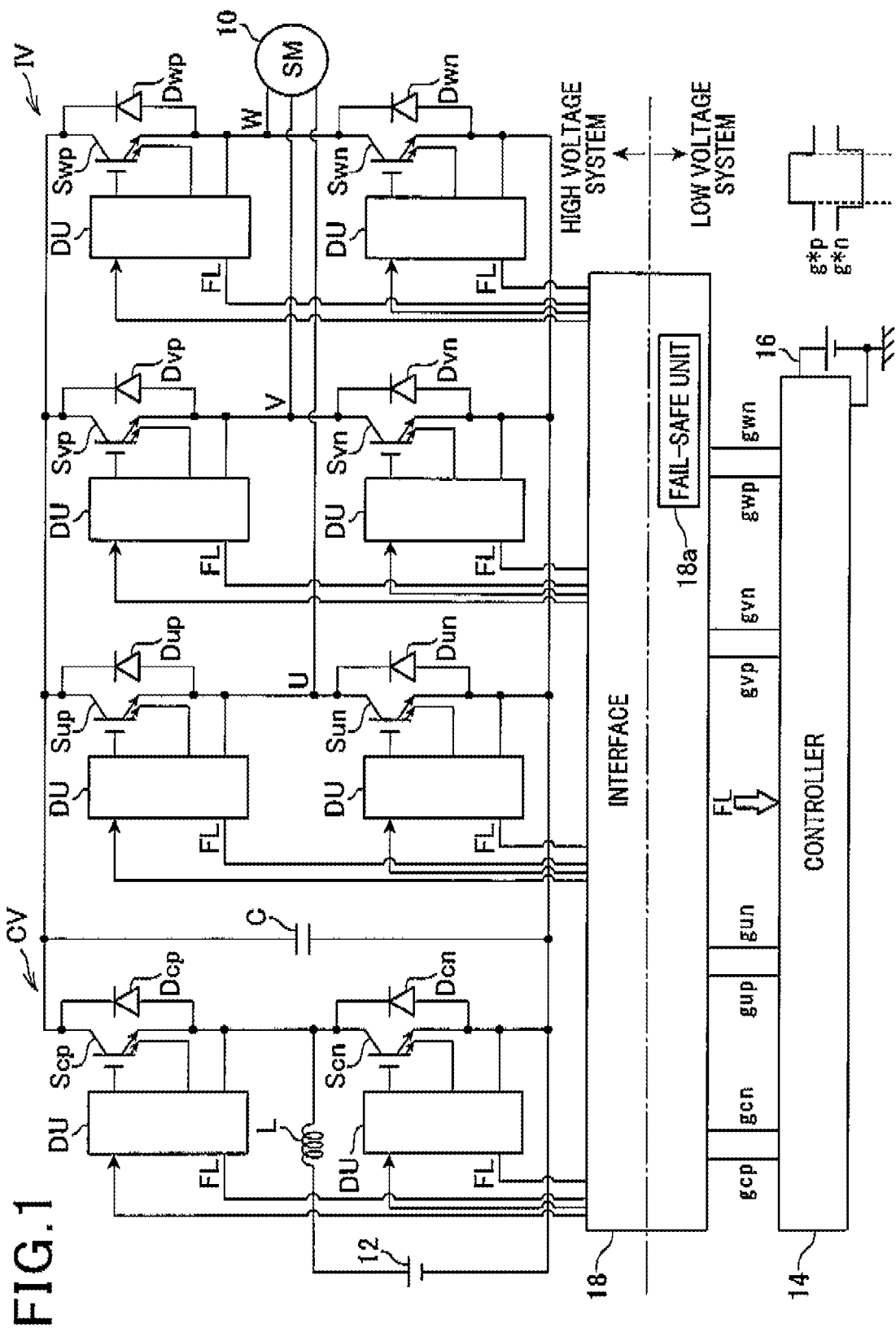
FIG. 1 is a view schematically illustrating an overall configuration of a control system for a motor-generator according to a first embodiment of the present disclosure.

Embodiments of the present disclosure will be described hereinafter with reference to the accompanying drawings. In the embodiments, like parts between the embodiments, to which like reference characters are assigned, are omitted or simplified in description to avoid redundant description.

First Embodiment

Referring to FIG. 1, there is illustrated a three-phase motor-generator as an example of rotating machines, referred to simply as a "motor-generator" 10, installed in, for example, a hybrid vehicle as a main engine according to a first embodiment. The motor-generator 10 is mechanically coupled to driving wheels (not shown) of the hybrid vehicle.

For example, as the motor-generator 10, a brushless DC motor, i.e. a three-phase SM (Synchronous Motor), is used.

The motor-generator 10 is comprised of, for example, a rotor including a magnetic field and a stator including three-phase windings, i.e. U-, V-, and W-phase windings. The rotor of the motor-generator 10 is rotated based on magnetic interaction between the magnetic field of the rotor and a rotating field generated by the three-phase windings when the three-phase windings are energized. For example, the three-phase windings (U-, V-, and W-phase windings) each have one end connected to a common junction (neutral point) and the other end to a separate terminal in, for example, a star-configuration.

In FIG. 1, there is also illustrated a control system 100 for controlling the motor-generator 10. The control system 100 is equipped with an inverter IV, a converter CV serving as a DC power source, a high-voltage battery 12, drive units, i.e. drivers, DU, a control unit 14, a low-voltage battery 16, and an interface 18.

To the motor-generator 10, the high-voltage battery 12 is electrically connected via the inverter IV and the converter CV. The high-voltage battery 12 has a terminal voltage, which is equal to or higher than 100 V, thereacross.

The converter CV includes a capacitor C, a pair of series-connected switching elements Scp and Scn, a pair of flywheel diodes Dcp and Dcn, and a reactor L. The capacitor C is connected in parallel to the inverter IV, and the series-connected switching elements Scp and Scn are connected in parallel to the capacitor C. The flywheel diodes Dcp and Dcn are connected in antiparallel to the corresponding switching elements Scp and Scn, respectively. One end of the reactor L is connected to both the positive terminal of the high-voltage battery 12 and the connection point between the switching elements Scp and Scn. A first end of the series-connected switching elements Scp and Scn of the converter CV is connected to the positive DC input line of the inverter IV, and a second end thereof, which is opposite to the first end, is connected to the negative DC input line of the inverter IV. The negative DC input line of the inverter IV is connected to the negative terminal of the battery 12.

The converter CV is operative to convert the terminal voltage of the high-voltage battery 12 into a voltage higher than the terminal voltage of the high-voltage battery 12, and output the boosted voltage as an output DC voltage thereof across the capacitor C. The predetermined upper limit of the step-up of the terminal voltage by the converter CV is set to a predetermined high voltage, such as 666 V.

The inverter IV is designed as a three-phase inverter. The inverter IV is provided with three pairs of series-connected high- and low-side (upper- and lower-arm) switching elements Sup and Sun, Svp and Svn, and Swp and Swn. The inverter IV is also provided with flywheel diodes Dup and Dun, Dvp and Dvn, and Dwp and Dwn electrically connected in antiparallel to the corresponding switching elements Sup and Sun, Svp and Svn, and Swp and Swn, respectively.

In the first embodiment, as the switching elements S*# (*=u, v, w, c, #=p, n), IGBTs are respectively used.

When power MOSFETs are used as the switching elements S*# (*=u, v, w, c, #=p, n), intrinsic diodes of the power MOSFETs can be used as the flywheel diodes, thus eliminating the flywheel diodes.

The three pairs of switching elements are parallelly connected to each other in bridge configuration. A connecting point through which each of the switching elements S∀p (∀=u, v, w) is connected to a corresponding one of the elements S∀n (∀=u, v, w) in series is connected to a bulbar and a high-voltage cable extending from the separate terminal of a corresponding one of the U-phase winding, V-phase winding, and W-phase winding. One end of the series-connected switching elements of each of the three pairs, such as the collector of the corresponding high-side switching element, is connected to the positive terminal of the high-voltage battery 12 via the positive DC input line. The other end of the series-connected switching elements of each of the three pairs, such as the emitter of the corresponding low-side switching element, is connected to the negative terminal of the high-voltage battery 12 via the negative DC input line. For example, the three-phase busbars of the three-phase connecting points of the inverter IV are connected to corresponding three-phase output terminals of a terminal holder, respectively. The three-phase output terminals of the terminal holder are connected to the three-phase high-voltage cables, respectively.

For example, the control unit 14 operates on a power-supply voltage, lower than the terminal voltage across the high-voltage battery 12, supplied from the low-voltage battery 16. Thus, the control unit 14 and the low-voltage battery 16 constitute a low voltage system. In contrast, the motor-generator 10, the converter CV, the inverter IV, and the high-voltage battery 12 constitute a high voltage system.

The interface 18 is provided with insulation members, such as photocouplers, provided for the respective switching elements S*# of the inverter IV and converter CV. Each of the photocouplers is comprised of a photodiode and a phototransistor. The photocouplers are configured to enable communications between the high and low voltage systems while establishing electrical insulation therebetween. Specifically, each of the photocouplers is configured to enable the control unit 14 to control a corresponding one of the switching elements S*# while establishing electrical insulation between the control unit 14 and a corresponding one of the switching elements S*#.

The control unit 14 is designed to individually drive the inverter IV and the converter CV to thereby control a controlled variable of the motor-generator 10, such as an output torque of the motor-generator 10.

Specifically, the control unit 14 is designed to individually send drive signals gcp and gcn to the drive units DU provided for the respective switching elements Scp and Scn, thus individually turning on or off the respective switching elements Scp and Scn. The control unit 14 is also designed to individually send drive signals gup, gun, gvp, gvn, gwp, and gwn to the drive units DU provided for the respective switching elements Sup, Sun, Svp, Svn, Swp, and Swn, thus individually turning on or off the respective switching elements Sup, Sun, Svp, Svn, Swp, and Swn. The individual turn-on or off of the respective switching elements Sup, Sun, Svp, Svn, Swp, and Swn convert the output DC voltage across the capacitor C into an AC voltage, and supply the AC voltage to the motor-generator 10.

Each of the drive signals g*# has a predetermined duty cycle, i.e. a predetermined ratio of on duration to the total duration of each switching cycle for a corresponding one of the switching elements S*# (see FIG. 1). Specifically, the control unit 14 is designed to complementarily turn on the high- and low-side switching elements S*# for each leg (phase) via the corresponding drive units DU according to the corresponding drive signals g*#. In other words, the control unit 14 is designed to alternately turn on the high-side switching element S*p of one leg (phase) and the low-side switching element S*n of the same leg (phase). This drive alternately closes the conductive path between the collector and emitter of the high-side switching element S*p of one leg and the conductive path between the collector and emitter of the high-side switching element S*n, of the same leg.

Next, an example of the circuit structure of each drive unit DU provided for a corresponding one switching element S*# will be described with reference to FIG. 2.

Figure 2:
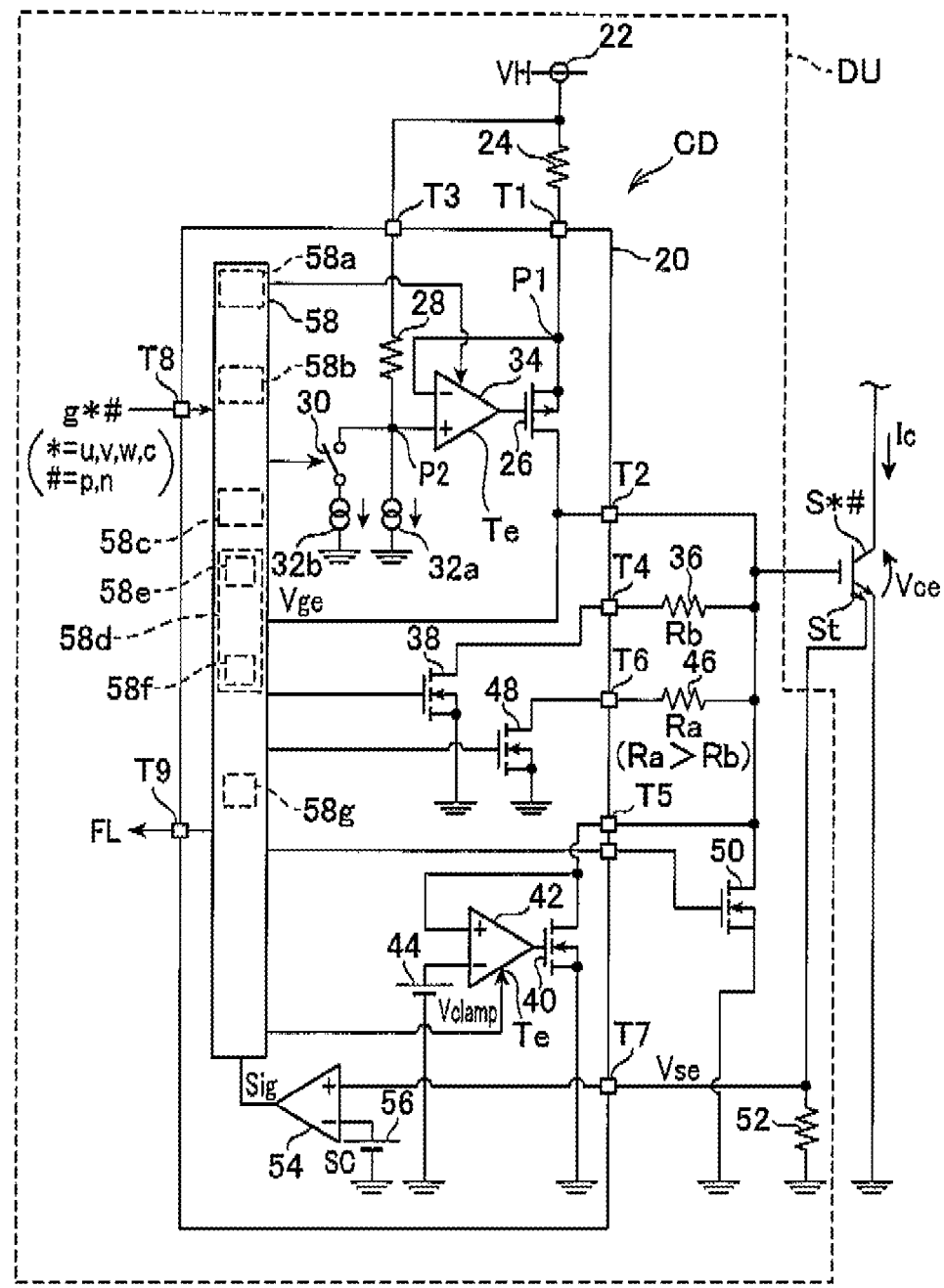
FIG. 2 is a circuit diagram schematically illustrating an example of the structure of each drive unit of the control system illustrated in FIG. 1.

Referring to FIG. 2, the drive unit DU is comprised of a drive IC 20 on a chip, a constant voltage power source 22, a resistor 24, a discharging resistor 36, a soft-turnoff resistor 46, an off-state holding switching element 50, and a sense resistor 52. The sense resistor 52 serves as, for example, a measuring module for measuring a value of a parameter correlated with the collector current Ic flowing between the collector and emitter of the switching element S*#.

The drive IC 20 has terminals T1 to T9, a constant-current switching element (SW) 26, a resistor 28, a switch 30, a first constant-voltage source 32a, and a second constant-voltage source 32b. The drive IC 20 also has a first operational amplifier 34, a discharging switching element (SW) 38, a clamping switching element 40, a second operational amplifier 42, a first power source, i.e. a first DC power source, 44, a soft-turnoff switching element (SW) 50, a comparator 54, a second power source, i.e. a second DC power source, 56, and a drive controller 58, As the constant-current switching element 26, a P-channel MOSFET is used. In contrast, as each of the discharging switching element 38, the clamping switching element 40, and the soft-turnoff switching element 48, an N-channel MOSFET is used.

The constant voltage power source 22 having a terminal voltage VH of, for example, 15 V thereacross is connected to a first end of the resistor 24. A second end of the resistor 24 is connected to the on-off control terminal, i.e. the gate, of the switching element S*# via the terminals T1 and T2. Specifically, the second end of the resistor 24 is connected to the terminal T1, the terminal T1 is connected to the source of the constant-current switching element 26 via a connection point P1, the drain of the constant-current switching element 26 is connected to the terminal T2, and the terminal T2 is connected to the gate of the switching element S*#.

The connection point between the first end of the resistor 24 and the constant voltage power source 22 is connected to a first end of the resistor 28 via the terminal T3, and a second end of the resistor 28 is connected to a first end of the first constant-current power source 32a. A second end of the first constant-current power source 32a is connected to, for example, a common potential line. The common potential line is connected to the output terminal, i.e. the emitter, of the switching element S*#, In this embodiment, the potential at the emitter of the switching element S*# is set to 0 V.

The first operational amplifier 34 has a non-inverting input terminal, an inverting input terminal, and an output terminal. The connection point P2 between the second end of the resistor 28 and the first end of the first constant-current power supply source 32a is connected to the non-inverting input terminal of the first operational amplifier 34. The inverting input terminal of the first operational amplifier 34 is connected to the connection point P1 between the terminal T1 and the source of the constant-current switching element 26. That is, the inverting input terminal of the first operational amplifier 34 is virtually short-circuited to the non-inverting input terminal thereof. The output terminal of the first operational amplifier 34 is connected to the gate of the constant-current switching element 26.

The connection point P2 between the second end of the resistor 28 and the first end of the first constant-current power supply source 32a is also connected to a first end of the second constant-current power source 32b via the switch 30, and a second end of the second constant-current power source 32b is connected to the emitter of the switching element S*# via the common potential line. For example, the resistors 24 and 28, the switch 30, the first and second constant current power sources 32a and 32b, and the first operational amplifier 34 serve as a constant-current driving circuit, in other words, a constant-current module, CD. The switch 30 is set to be in an off state in a normal mode of the drive controller 58 in which the switching element S*# is normally operating during execution of a clamping task described later.

In the first embodiment, the first operational amplifier 34 has an enable terminal Te connected to the drive controller 58. As described later, while an enable signal is input to the enable terminal Te of the first operational amplifier 34 from the drive controller 58, the first operational amplifier 34 is activated.

Next, a constant-current charging task of the constant-current module CD will be described.

The first operational amplifier 34 is configured such that the two inputs are virtually short-circuited via the constant-current switching element 26. For this reason, the first operational amplifier 34 is configured to drive the constant-current switching element 26, so that the potential at the connection point P1 between the terminal T1 and the source of the constant-current switching element 34, i.e. the potential at the potential at the terminal T1, is maintained at the potential at the connection point P2 between the second end of the resistor 28 and the first end of the first constant current power supply source 32a.

Specifically, when activated, the virtually short-circuited first operational amplifier 34 turns on or off the constant-current switching element 26 as a variable resistor, thus matching the potential at the connection point P1 with the potential at the connection point P2. Assuming that a constant current based on the first constant current power supply source 32a is referred to as I32a, the resistance of the resistor 28 is referred to as R28, the potential at the connection point P1 is referred to as PO1, and the potential at the connection point P2 is referred to as PO2, the potential PO1 at the connection point P1 can be expressed as the following equation:

$$PO1 = VH - R28 \times I32a = PO2$$

This results in a constant charging current, given by (VH−PO1)/R24, being supplied to the gate of the switching element S*#; R24 represents the resistance of the resistor 24. This charges the gate; i.e. the gate capacitor, of the switching element S*#, so that the gate voltage increases. At that time, because the first operational amplifier 34 turns on or off the constant-current switching element 26 as a variable resistor to maintain the potential PO1 at the connection point P1 matching with the potential PO2 at the connection point P2, the voltage across the constant-current switching element 26 decreases to cancel out the increase in the gate voltage of the switching element S*#. This results in maintenance of agreement in potential between the connection point P1 and the connection point P2.

When the gate voltage of the switching element S*# has increased up to the potential P1 at the connection point P1, even if the voltage across the constant-current switching element 26 is changed, it is difficult to keep a potential difference between the potential PO1 at the connection point P1 and the terminal voltage VH of the constant voltage power source 22. In other words, even if the constant-current switching element 26 operates as a variable resistor, it is difficult to maintain the potential PO1 at the connection point P1 at the constant level of the potential PO2. Thus, the constant-current switching element 26 is constantly in the on state by the first operational amplifier 34. This results in the gate capacitor of the switching element S*# is charged based on the terminal voltage VH of the constant voltage power source 22, so that the gate voltage of the switching element S*# finally becomes the voltage VH.

The gate of the switching element S*# is also connected to a first end of the discharging resistor 36, and a second end of the discharging resistor 36 is connected to the terminal T4. The terminal T4 is connected to the drain of the discharging switching element 38, and the source of the discharging switching element 38 is connected to the source of the switching element S*# via the common potential line. The gate of the discharging switching element 38 is connected to the drive controller 58. In other words, the gate of the switching element S*# is connected to the emitter thereof via the discharging resistor 36, the terminal T4, and the discharging switching element 38.

In addition, the gate of the switching element S*# is connected to the terminal T5, and the terminal T5 is connected to the drain of the clamping switching element 40. The source of the clamping switching element 40 is connected to the emitter of the switching element S*# via the common potential line. The second operational amplifier 42 has a non-inverting input terminal, an inverting input terminal, and an output terminal, The connection point between the terminal T5 and the drain of the clamping switching element 40 is connected to the non-inverting input terminal of the second operational amplifier 42. The inverting input terminal of the second operational amplifier 42 is connected to the positive terminal of the first power source 44, and the negative terminal of the first power source 44 is connected to the emitter of the switching element S*# via the common potential line. The gate of the clamping switching element 40 is connected to the output terminal of the second operational amplifier 42. The second operational amplifier 42 has an enable terminal Te connected to the drive controller 58. As described later, while an enable signal is input to the enable terminal Te of the second operational amplifier 42 from the drive controller 58, the second operational amplifier 42 is activated.

The first power source 44 has a terminal voltage, referred to as a clamp voltage $V_{clamp}$, determined to limit the voltage applied to the on-off control terminal of the switching element S*#, i.e. the gate voltage Vge of the switching element S*#, from exceeding a value that can prevent a current, whose value may excessively reduce the reliability of the switching element S*#, from flowing through the switching element S*#. For example, the limited value for the gate voltage Vge is set to 12.5 V.

Specifically, in the first embodiment, the clamp voltage $V_{clamp}$ is set to be equal to or higher than a threshold voltage Vth of the switching element S*#, and to be lower than an upper limit VH of the gate voltage Vge, i.e. the terminal voltage VH of the constant voltage power source 22. The threshold voltage Vth of the switching element S*# is set so that, when the gate voltage Vge becomes the threshold voltage Vth, the switching element S*# is turned on.

Moreover, the gate of the switching element S*# is connected to a first end of the soft-turnoff resistor 46, and a second end of the soft-turnoff resistor 46 is connected to the terminal T6. The terminal T6 is connected to the drain of the soft-turnoff switching element 48, and the source of the soft-turnoff switching element 48 is connected to the emitter of the switching element S*# via the common potential line. The gate of the soft-turnoff switching element 48 is connected to the drive controller 58. In other words, the gate of the switching element S*# is connected to the emitter thereof via the soft-turnoff resistor 46, the terminal T6, and the soft-turnoff switching element 48. The gate of the switching element S*# is connected to the drain of the off-state holding switching element 50, and the source of the off-state holding switching element 50 is connected to the emitter of the switching element S*# via the common potential line.

The switching element S*# has a sense terminal St for outputting a minute current, i.e. a sense current, associated with a current, i.e. a collector current Ic, flowing through the conductive path between the input terminal and the output terminal thereof, i.e. between the collector and the emitter thereof. For example, the magnitude of the minute current is 0.01% of that of the collector current Ic.

The sense terminal St is connected to a first end of the resistor 52, and a second end, opposing the first end, of the resistor 52 is connected to the emitter of the switching element S*# via the common potential line.

When the collector current Ic flows through the conductive path of the switching element S*#, the sense current correlated with the collector current Ic flows through the resistor 52, so that a voltage drop across the resistor 52 occurs. Thus, it is possible to obtain the voltage drop across the resistor 52 as a sense voltage Vse at the first end of the resistor 52 connected to the sense terminal St; the sense voltage Vse is a parameter correlated with an electric state quantity of the magnitude of the collector current Ic flowing through the switching element S*#. That is, the level of the sense voltage Vse is as a function of i.e. correlates with, the magnitude of the collector current Ic flowing through the switching element S*#.

In the first embodiment, the positive polarity of sense voltage Vse is defined when the potential at the first end of the resistor 52 connected to the sense terminal St is higher than the potential at the emitter of the switching element S*#, As described above, the potential at the emitter of the switching element S*# is set to zero.

The comparator 54 has a non-inverting input terminal, an inverting input terminal, and an output terminal. The sense terminal St is connected to the non-inverting input terminal of the comparator 54. The inverting input terminal of the comparator 54 is connected to the positive terminal of the second power source 56, and the negative terminal of the comparator 54 is connected to, for example, the common input terminal. The output terminal of the comparator 54 is connected to the drive controller 58. In the first embodiment, the second power source 56 has a terminal voltage, referred to as a short-circuit threshold voltage, SC. The terminal voltage (the short-circuit threshold voltage) SC is set to a level of the sense voltage Vse; the level of the sense voltage Vse is associated with a level of the collector current Ic flowing through the switching element S*# when there is an upper-lower arm short-circuit. An output signal Sig of the comparator 54 is input to the drive controller 58. Specifically, the output signal Sig of the comparator 54 has a logical high level when the level of the sense voltage Vse is equal to or higher than the short-circuit threshold voltage SC, and has a logical low level when the level of the sense voltage Vse is lower than the short-circuit threshold voltage SC. In other words, the output signal Sig of the comparator 54 has the logical high level when the level of the collector current Ic corresponding to the level of the sense voltage Vse is equal to or higher than a preset current level corresponding to the short-circuit threshold voltage SC, and has the logical low level when the level of the collector current Ic is lower than the preset current level.

Note that the upper-lower arm short-circuit means that simultaneous turn-on of a high-side switching element S*p of one phase and a low-side switching element S*n of the same phase produces a conductive path of an overcurrent, i.e. a short-circuit current, for the pair of high- and low-side switching elements S*# of the same phase. That is, the conductive path of an overcurrent for the upper-lower arm short-circuit is established between a high-side switching element S*p of one phase and a low-side switching element S*n of the same phase without passing through the motor-generator 10, i.e. the load. For example, the upper-lower arm short-circuit is caused when one of a high- and low-side switching elements S*p and S*n of one phase is switched to the on state while there is a short-circuit in the other thereof.

The drive controller 58 is operative to receive the drive signal g*# input thereto from the controller 14 via the interface 18 and the terminal T8. The drive signal g*# has one of a predetermined first logical level, i.e. a high level, defined as an on command, and a predetermined second logical level, i.e. a low level, defied as an off command.

The drive controller 58 is operative to alternately turn on the constant-current switching element 26 and the discharging switching element 38 using the drive signal g*#, thus alternately performing the charging task, i.e. the constant-current control task, and a discharging task for the gate of the switching element S*#.

Specifically, the drive controller 58 functionally includes a charging unit 58a and a discharging unit 58b. The charging unit 58a and the constant-current driving circuit CD serve as, for example, a charging module, and the discharging unit 58b, the discharging switching element 38, and the discharging resistor 36 serve as, for example, a discharging module.

The charging unit 58a of the drive controller 58 turns off the discharging switching element 38 and outputs the enable signal to the enable terminal Te of the first operational amplifier 34 to control the constant-current switching element 26 if the drive signal g*# has the high level showing the on command based on the constant-current charging task of the constant-current module CD set forth above. The control of the constant-current switching element 26 with the turn-off of the discharging switching element 38 charges the gate of the switching element S*# based on the constant charging current supplied to the gate thereof. This changes the switching element S*# from the off state to the on state.

On the other hand, if the drive signal g*# input to the drive controller 58 is changed from the high level to the low level showing the off command, the discharging unit 58b turns on the discharging switching element 38 and shuts off the output of the enable signal to the enable terminal Te of the first operational amplifier 34. This turns off the constant-current switching element 26, The turn-on of the discharging switching element 38 discharges the gate of the switching element S*# through the discharging switching element 38 via a discharging path defined between the gate and source of the switching element S*# via the discharging resistor 36 and the discharging switching element 38. This changes the switching element S*# from the on state to the off state.

The drive controller 58 functionally includes an off-state holding unit 58c. The off-state holding unit 58c performs an off-state holding task that:

monitors the level of the gate voltage Vge input thereto through the terminal T2;

determine whether the monitored level of the gate voltage Vge has become a first predetermined voltage Vα set to be lower than the first threshold voltage Vth; and turn on or off the off-state holding switching element 50 based on a result of the determination and the drive signal g*#.

Specifically, during execution of the discharging task, if it is determined that the monitored level of the gate voltage Vge has become the first predetermined voltage Vα, the off-state holding unit 58c turns on the off-state holding switching element 50. Otherwise, during execution of the charging task, or during execution of the discharging task while the monitored level of the gate voltage Vge is lower than the first predetermined voltage Vα, the off-state holding unit 58c maintains the off-state holding switching element 50 in an off state.

The on state of the off-state holding switching element 50 short-circuits the gate and emitter of the switching element S*# to thereby hold the off state of the switching element S*#. The gate voltage applied to the off-state holding switching element 50 for turning on it is set to a value that causes the off-state holding switching element 50 to be turned on while the off-state holding element 50 is in its non-saturated region in which the drain current increases with an increase of the drain-source voltage. That is, the on resistance of the off-state holding switching element 50 during the off-state holding switching element 50 being in the on state is substantially zero. Thus, the impedance of an electrical path including the off-state holding switching element 50 between the gate and source of the switching element S*# becomes lower than that of each of:

the first electrical path through the constant-current switching element 26 between the gate and source of the switching element S*#; and the second electrical path through the discharging switching element 38 between the gate and source of the switching element S*#.

This prevents the switching element S*# from erroneously being on due to high-frequency noise superimposition on the gate thereof through the medium of parasitic capacitance between the collector and emitter of the switching element S*# during the off state of the switching element S*#.

In addition, the drive controller 58 functionally includes an overcurrent-protecting unit 58d. The overcurrent-protecting unit 58d is operative to perform an overcurrent protection task based on the gate voltage Vge input thereto via the terminal T2, the output signal Sig of the comparator 54 input thereto, and the like. The overcurrent protection task includes a clamping task and a soft turn-off task. Specifically, the overcurrent-protecting unit 58d functionally includes a clamping unit, in other words, a limiting unit, 58e and a soft-turnoff unit 58f. The clamping unit 58e, the clamping switching element 40, the operational amplifier 42, and the first power source 44 serve as, for example, a clamping module. The soft-turnoff unit 58f, the soft-turnoff switching element 48, the soft-turnoff resistor 46, the comparator 54, and the second power source 56 serve as, for example, a limiting module.

First, let us describe the clamping task carried out by the clamping unit 58e.

The clamping task is designed to have output the enable signal to the enable terminal Te of the second operational amplifier 42 for a predetermined time interval $T_{clamp}$, such as a fixed time, since the gate voltage Vge reached a second predetermined voltage Vβ while the gate of the switching element S*# is charged in response to the on command of the drive signal g*#. The second predetermined voltage Vβ is set to be lower than a Miller voltage. The Miller voltage means a substantially constant level at which the gate voltage Vge remains while the drain voltage rises or falls during the charging task or discharging task of the switching element S*#. The enable signal output to the enable terminal Te of the second operational amplifier 42 turns on the clamping switching element 40. For example, the predetermined time interval $T_{clamp}$ will be referred to as clamp-filter time $T_{clamp}$.

That is, the clamping task is designed to limit an increase of the gate voltage Vge with respect to the clamp voltage $V_{clamp}$ before the arrival of the gate voltage Vge at the upper limit VH while the gate of the switching element S*# is charged in response to the on command of the drive signal g*#.

The clamping task restricts, when there is an upper-lower arm short-circuit, the collector current Ic flowing through the switching element S*# until the switching element S*# is switched to the off state by the soft-turnoff task described later.

For example, the clamp-filter time $T_{clamp}$ according to the first embodiment is set to be slightly longer than the sum of:

a maximum value of time required from the timing when the gate voltage Vge reaches the second predetermined voltage Vβ to the timing when the gate voltage Vge exceeds the short-circuit threshold voltage SC; and a short-circuit filter time Tsc used by the soft-turnoff task described later.

Next, let us describe the soft-turnoff task carried out by the soft-turnoff unit 58f.

Note that, in the first embodiment, the soft-turnoff resistor 46 has a resistance Ra, the discharging resistor 36 has a resistance Rb, and the resistance Ra is higher than the resistance Rb.

The soft-turnoff task is designed to stop the output of the enabling signal to the enable terminal Te of the first operational amplifier 34 and turn of the soft-turnoff switching element 48 when it is determined that the logical level of the output signal Sig of the comparator 54 is continuously maintained at the logical high level for the predetermined short-circuit filter time Tsc. The soft-turnoff task discharges the gate of the switching element S*# via the soft-turnoff switching element 48 and the soft-turnoff resistor 46, thus forcibly turning off the switching element S*# slower than turnoff of the switching element S*# through the discharging switching element 38 and discharging resistor 36.

The short-circuit filter time Tsc serves as means for preventing erroneous execution of the soft-turnoff task due to instantaneous increase of the level of the output signal Sig of the comparator 54 when noise is contained in the output signal Sig.

As described above, the resistance Ra of the soft-turnoff resistor 46 is higher than the resistance Rb of the discharging resistor 36, so that the resistance of the discharge path of the gate of the switching element S*# via the soft-turnoff switching element 48 and resistor 46 is higher than that of the discharge path of the gate of the switching element S*# via the discharging switching element 38 and resistor 36.

If the switching speed of the switching element S*# from the on state to the off state were high while the collector current Ic having an excessively high value flows through the switching element S*# as an overcurrent, there might be an excessively high surge voltage produced due to the high-speed shutdown of the switching element S*#. Thus, in this situation, the soft-turnoff task forcibly changes the resistance of the discharge path of the gate of the switching element S*# via the soft-turnoff resistor 46 to be higher than that of discharge path of the gate of the switching element S*# via the discharging resistor 36 in normal situations. This prevents the magnitude of a surge produced due to the turn-off of the switching element S*# from being suppressed.

When executing the soft-turnoff task, the soft-turnoff unit 58f of the drive controller 58 executes a task to output a fail-safe signal FL and a task to disable the drive of each of the constant-current switching element 26 and the discharging switching element 38. The fail-safe signal FL represents an abnormal state in the operation of the switching element S*#, and is output to the low-voltage system, i.e. the controller 14, via the terminal T9 and the interface 18.

Referring to FIG. 1, the interface 18 is comprised of a fail-safe unit 18a, and the fail-safe unit 18a shuts down each of the inverter IV and the converter CV in response to the fail-safe signal FL.

Next, let us further describe in detail that the overcurrent protection task is performed efficiently if there is an upper-lower arm short-circuit using FIG. 3

FIGS. 3A to 3E are a joint timing chart schematically illustrating an example of specific operations of the overcurrent protection task by the drive controller 58 of the drive unit DU when there is an upper-lower arm short-circuit so that an overcurrent flows through the switching element S*#.

Figure 3A:
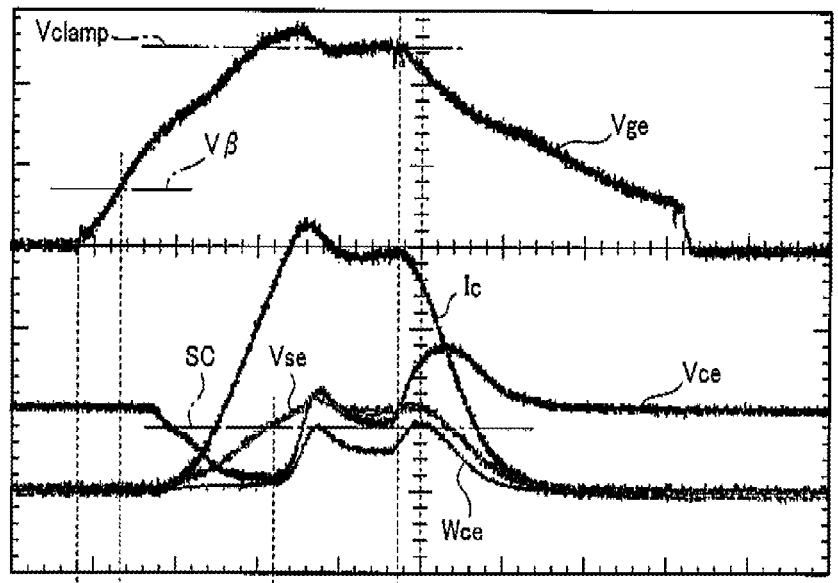
FIGS. 3A to 3E are a joint timing chart schematically illustrating an example of specific operations of an overcurrent protection task executed by a drive controller of the drive unit illustrated in FIG. 2 when there is an upper-lower arm short-circuit so that an overcurrent flows through a switching element to be driven by the drive unit.
Figure 3B:
Figure 3C:
Figure 3D:
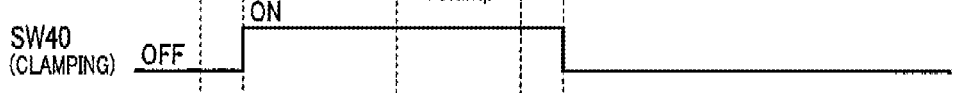
Figure 3E:
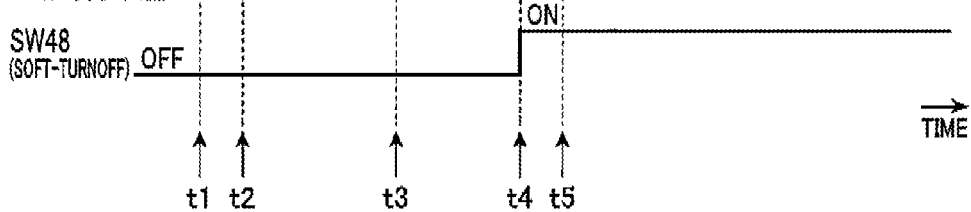

Specifically, FIG. 3A schematically illustrates an example of how the gate voltage Vge, the collector current Ic, the collector-emitter voltage Vice, the sense voltage Vse, and a switching loss Wce expressed by the product of the collector current Ic and the collector-emitter voltage Vice vary. FIG. 3B schematically illustrates an example of how the constant-current switching element 26 is driven, and FIG. 3C schematically illustrates an example of how the discharging switching element 38 is driven, FIG. 3D schematically illustrates an example of how the clamping switching element 40 is driven, and FIG. 3E schematically illustrates an example of how the soft-turnoff switching element 48 is driven.

Referring to FIG. 3, when the discharging switching element 38 is turned off, and the enabling signal output to the first operational amplifier 34 causes the constant-current switching element 26 to be turned on at time t1. These operations start the charging task that causes the gate voltage Vge to start increasing. The increase in the gate voltage Vge causes the collector current Ic to start flowing, resulting in an increase of the sense voltage Vse.

Thereafter, when it is determined that the gate voltage Vge reaches the second predetermined voltage Vβ at time t2, the drive controller 58 starts output of the enable signal to the second operational amplifier 42. This results in execution of the clamping task, which turns on the clamping switching element 40 at the time t2, and maintains it in the on state for the clamp-filter time $T_{clamp}$ from the time t2.

The clamp-filter time $T_{clamp}$ according to the first embodiment is set to be slightly longer than the sum of the maximum value of time required from the timing when the gate voltage Vge reaches the second predetermined voltage Vβ to the timing when the gate voltage Vge exceeds the short-circuit threshold voltage SC; and the short-circuit filter time Tsc. For this reason, in the example of the specific operations of the overcurrent protection task illustrated in FIG. 3, when the level of the sense voltage Vse exceeds the short-circuit threshold voltage SC at time t3 within the clamp-filter time $T_{clamp}$, it is determined that the logical level of the output signal Sig of the comparator 54 is changed from the logical low level to the logical high level at the time t3. At the time t3, counting the duration of the logical level of the output signal Sig being in the logical high level is started.

Thereafter, when it is determined that the counted duration reaches the predetermined short-circuit filter time Tsc, so that the logical level of the output signal Sig of the comparator 54 is continuously maintained at the logical high level for the predetermined short-circuit filter time Tsc at time t4, it is determined that the electrical path between the collector and emitter of the switching element S*# is short-circuited. Thus, the soft-turnoff task turns off the soft-turnoff switching element 48, causing the switching element S*# to be forcibly turned off. After the time t4, when the clamp-filter time $T_{clamp}$ has elapsed at time t5, the clamping switching element 40 is switched from the on state to the off state.

FIGS. 3A to 3E schematically illustrate a case where the overcurrent protection task is ideally performed if there is an upper-lower arm short-circuit. However, the inventors have been facing a problem that the overcurrent protection task cannot turn off the switching element S*# when there is an overcurrent flowing through the switching element S*# due to the occurrence of an upper-lower arm short-circuit.

Let us describe the problem using FIGS. 4A to 4E respectively corresponding to FIGS. 3A to 3E.

Referring to FIG. 4, turn-off of the discharging switching element 38 and turn-on of the constant-current switching element 26 start the charging task that causes the gate voltage Vge to start increasing at time t11. The increase in the gate voltage Vge causes the collector current Ic to start flowing, resulting in an increase of the sense voltage Vse.

Thereafter, when it is determined that the gate voltage Vge reaches the second predetermined voltage Vβ at time t12, the drive controller 58 starts output of the enable signal to the second operational amplifier 42. This results in execution of the clamping task, which turns on the clamping switching element 40 at the time t12, and maintains it in the on state for the clamp-filter time $T_{clamp}$ from the time t12.

Thereafter, when the level of the sense voltage Vse exceeds the short-circuit threshold voltage SC at time t13 within the clamp-filter time $T_{clamp}$ it is determined that the logical level of the output signal Sig of the comparator 54 is changed from the logical low level to the logical high level at the time t13. At the time t3, counting the duration of the logical level of the output signal Sig being in the logical high level is started.

However, immediately after the time t13, there is a situation where the gate voltage Vge rapidly decreases until the short-circuit filter time Tsc has elapsed, so that the gate voltage Vge deviates from the clamp voltage $V_{clamp}$. This causes the collector current Ic to rapidly decrease, causing a rapid increase of the collector-emitter voltage Vice. This results in an increase of the switching loss in the switching element S*# and reduction of the reliability of the switching element S*#.

Such a rapid decrease of the collector current Ic due to decrease of the gate voltage Vge also causes the sense voltage Vse to rapidly decrease. For this reason, at time t14, the level of the sense voltage Vse becomes lower than the short-circuit threshold voltage SC, so that the drive controller 58 cannot determine that the switching element S*# is short-circuited. In other words, the level of the sense voltage Vse becoming lower than the short-circuit threshold voltage SC causes the drive controller 58 to determine that the switching element S*# to be returned from the short-circuited condition. Thus, the counted duration of the logical level of the output signal Sig being in the logical high level is reset at the time t14 before reaching the short-circuit filter time Tsc, making it difficult to perform the soft-turnoff task. This results in an increase of the gate voltage Vge based on the charging task after the time t14 again. This may cause the collector current Ic with the level higher than the threshold level to flow as an overcurrent, resulting in reduction of the reliability of the switching element S*#.

Because the counted duration of the logical level of the output signal Sig being in the logical high level is reset before reaching the short-circuit filter time Tsc, the soft-turnoff task will not be carried out after the time t14 (see FIG. 4E). In addition, once the gate voltage Vge decreases to deviate from the clamp voltage $V_{clamp}$, it may be difficult for the charging task to increase the gate voltage Vge up to the clamp voltage $V_{clamp}$. This will result in repetition of the cycle of execution of the clamping task and cancellation thereof while the counted duration of the of the logical level of the output signal Sig being in the logical high level will not reach the short-circuit filter time Tsc for each cycle after the time t14.

For this reason, in the case illustrated in FIG. 4, the switching element S*# is externally controlled to be forcibly turned off at time t16 after the time t15.

Figure 5:
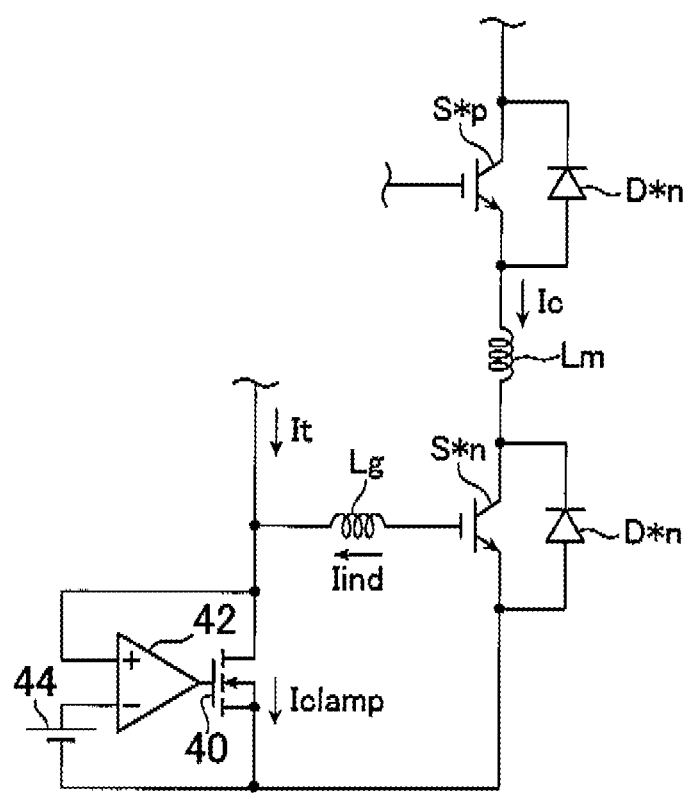
FIG. 5 is a circuit diagram schematically illustrating an impact of magnetic coupling on a gate voltage of the switching element.

Next, let us describe how such a downside deviation of the gate voltage Vge from the clamp voltage $V_{clamp}$ takes place while the clamping task is being performed. FIG. 5 schematically illustrates a pair of high- and low-side switching elements S*p and S*n of a same phase, a pair of corresponding flywheel diodes D*p and D*n, the components 40, 42, and 44 provided for the low-side switching element S*n.

Referring to FIG. 5, there a floating inductance Lm existing in a collector-current input path, referred to as the first conductive path, passing through the conductive path between the collector and emitter of the low-side switching element S*n; the floating inductance Lm is caused in the corresponding wire. There is also a floating inductance Lg existing in a conductive path, referred to as a second conductive path, connected to the gate of the low-side switching element S*n and to the drain of the clamping switching element 40; the floating inductance Lg is caused in the corresponding wire.

In the first embodiment, the floating inductance Lm and the floating inductance Lg are magnetically coupled to each other. This magnetic coupling may cause electrical charges, i.e. positive charges, to be transferred from/to the gate of the low-side switching element S*n depending on the rate of change of the collector current Ic, i.e. the time-derivative value of the collector current Ic.

Specifically, in the first embodiment, an increase of the collector current Ic of the low-side switching element S*n due to an upper-lower arm short-circuit generates a self-induced EMF across the floating inductance Lm to have a direction cancelling the increase of the collector current Ic. Because the floating inductance Lg is magnetically coupled to the floating inductance Lm, a similar self-induced EMF is generated across the floating inductance Lg to have a direction cancelling the increase of the collector current Ic, i.e. a direction to cause positive charges to be transferred to the gate of the low-side switching element S*n.

Thereafter, a decrease of the collector current Ic while the gate voltage Vge is maintained at the clamp voltage and thereabout, which is illustrated by the waveform of the collector current Ic within the time range from the time t13 to the time t14 in FIG. 4A, generates a self-induced EMF across the floating inductance Lm to have a direction cancelling the decrease of the collector current Ic. Because the floating inductance Lg is magnetically coupled to the floating inductance Lm, a similar self-induced EMF is generated across the floating inductance Lg to have a direction cancelling the decrease of the collector current Ic, i.e. a direction to cause positive charges to be transferred from the gate of the low-side switching element S*n to the clamping switching element 40. The transfer of the positive charges from the gate of the low-side switching element S*n to the clamping switching element 40 causes an induced current Iind to flow through the second conductive path to the clamping switching element 40 (see FIG. 5).

Assuming that no magnetic coupling is generated, the constant current It based on the terminal voltage VH of the constant voltage power source 22, flowing through the constant-current switching element 26, is branched into a current being supplied to the gate of the low-side switching element low-side switching element S*n as the charging constant current, and a current being supplied to the clamping switching element 40 as a clamping current $I_{clamp}$. The charging constant current permits the gate voltage Vge to be maintained at the clamp voltage $V_{clamp}$.

In contrast, assuming that the magnetic coupling is generated, because the charging constant current is reduced by the induced current Iind, it is difficult for the constant current It based on the terminal voltage VH of the constant voltage power source 22 to compensate for the reduction of the induced current Iind, resulting in reduction of the gate voltage Vge.

In order to address such a problem of gate-voltage drop, the drive controller 58 functionally includes a voltage correcting unit 58g operative to perform a voltage correcting task that corrects the gate voltage Vge such that the gate voltage Vge approaches the clamp voltage $V_{clamp}$ during the clamping task being executed.

An example of a specific routine for the voltage correcting task will be described hereinafter with reference to FIG. 6. Note that the drive controller 58 of each drive unit DU can be configured as a programmed logic unit, a hard-wired logic unit, or the combination of hardwired-logic and programmed-logic hybrid units, and can repeatedly carry out the routine, i.e. the voltage correcting routine, every preset cycle as an example.

Figure 6:
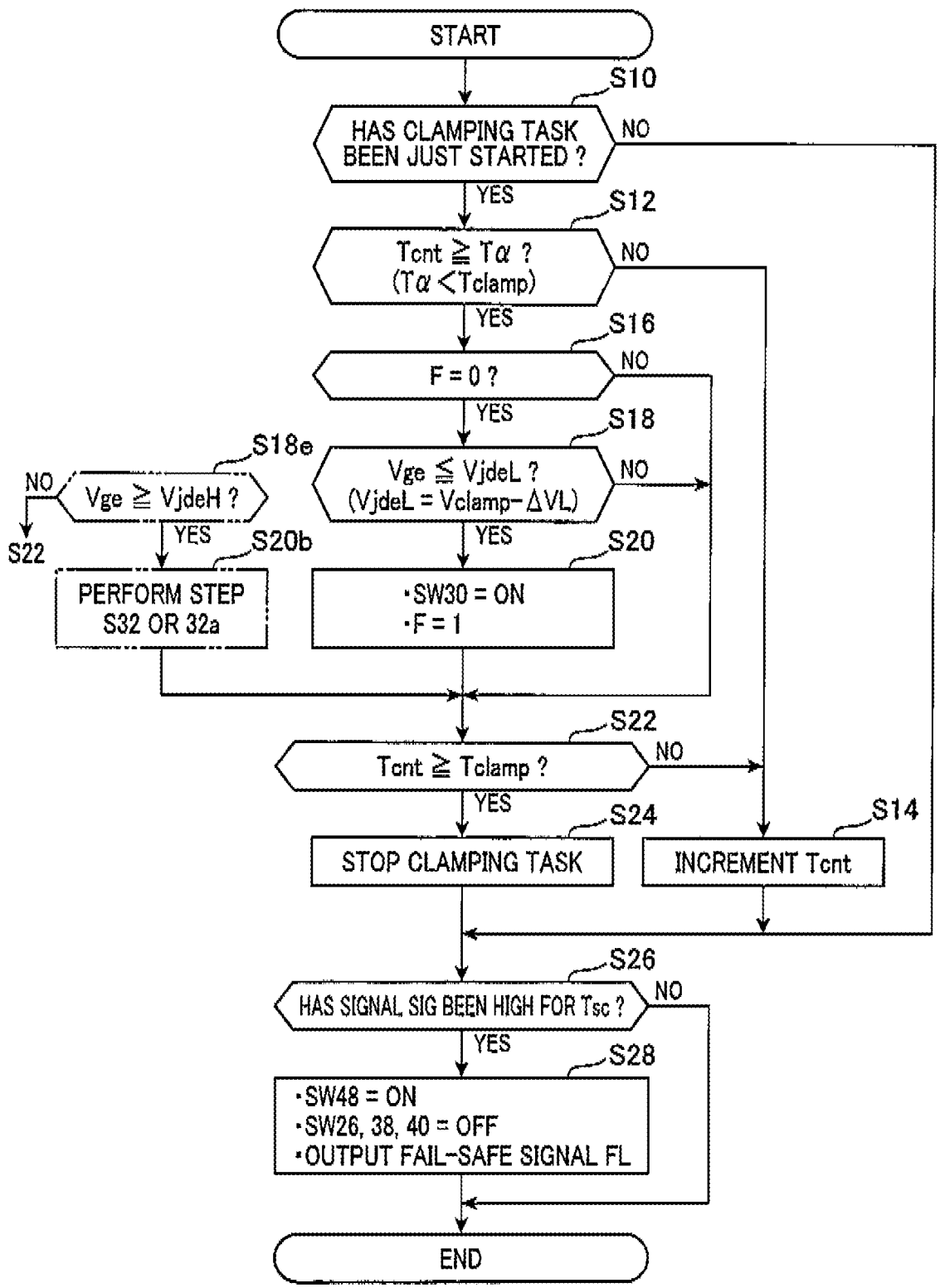
FIG. 6 is a flowchart schematically illustrating an example of a voltage correcting routine carried out by each drive unit of the control system illustrated in FIG. 1.

Referring to FIG. 6, when launching the voltage correcting routine, the voltage correcting unit 58g determines whether the gate voltage Vge has just reached the second predetermined voltage Vβ, and therefore, that the clamping task has been just started in step S10. Upon determination that the clamping task has been just started (YES in step S10), the voltage correcting unit 58g carries out the operation in step S12.

In step S12, the voltage correcting unit 58g determines whether a value of a counter Tcnt, which is a hardware or software counter previously incorporated therein for measuring a period since the start of the clamping task, is equal to or more than a preset period Tα. An initial value of the counter Tcnt is set to 0. The preset period Tα is determined such that, until the preset period Tα has elapsed since the start of the clamping task, it is possible to obtain a value of the gate voltage Vge having decreased before the sense voltage Vse becomes equal to or more than the short-circuit threshold voltage. For example, the preset period Tα is determined to be lower than the clamp-filter time $T_{clamp}$.

The operation in step S12 aims to increase the accuracy of determining whether the gate voltage Vge deviates from the clamp voltage $V_{clamp}$ in step S18 described later. That is, immediately after the start of the clamping task, the gate voltage Vge is increasing continuously, in other words, there is no drop of the gate voltage Vge. Thus, even if a value of the gate voltage Vge that is increasing were used to determine whether the gate voltage Vge deviates from the clamp voltage $V_{clamp}$, it could be difficult to reliably determine whether the gate voltage Vge deviates from the clamp voltage $V_{clamp}$. For this reason, the operation in step S12 disables the gate voltage Vge from being used for the voltage correcting task within the period during which the value of the counter Tcnt representing the measured period since the start of the clamping task is determined to be less than the preset period Tα.

Specifically, upon determination that the counted value is less than the preset period Tα (NO in step S12), the voltage correcting routine proceeds to step S14. In step S14, the voltage correcting unit 58g increments, by, for example, 1, the value of the counter Tcnt. Thereafter, the voltage correcting routine proceeds to step S26.

Otherwise, upon determination that the counted value is equal to or more than the preset period Tα (YES in step S12), the voltage correcting routine proceeds to step S16. In step S16, the voltage correcting unit 58g determines whether a completion flag F stored therein beforehand is set to 0. The completion flag is a bit having a logical low value, represented by 0, or a logical high value, represented by 1. An initial value of the completion flag F is set to 0. Specifically, the completion flag F being set to 0 represents that correction of the gate voltage Vge has not been performed yet, and the completion flag F being set to 1 represents that correction of the gate voltage Vge has been started.

Upon determination that the completion flag F is set to (YES in step S16), the voltage correcting unit 58g carries out the operation in step S18 to determine whether the gate voltage Vge is equal to or less than a low-side threshold voltage VjdeL. The operation in step S18 serves as a determining module that aims to determine whether the gate voltage Vge deviates downwardly from the clamp voltage $V_{clamp}$. In the first embodiment, the low-side threshold voltage VjdeL is set to a value obtained by subtracting a first preset value ΔVL greater than zero from the clamp voltage $V_{clamp}$. The first preset value ΔVL is set such that whether the gate voltage Vge deviates downwardly from the clamp voltage $V_{clamp}$ can be reliably determined without excessive drop of the gate voltage Vge relative to the clamp voltage $V_{clamp}$. For example, the first preset value ΔVL is set to a value as low as possible.

Upon determination that the gate voltage Vge is equal to or less than the low-side threshold voltage VjdeL (YES in step S18), the voltage correcting unit 58g determines that the gate voltage Vge deviates downwardly from the clamp voltage $V_{clamp}$. Then, the voltage correcting unit 58g carries out the operation in step S20 to turn on the switch 30, and set the completion flag F to 1; the operation in step S20 serves as, for example, a correcting module. The turn-on of the switch 30 causes the second constant current power source 32b to increase a current flowing through the resistor 28, thus increasing the difference in potential across the resistor 28. This reduces the potential PO2 at the connection point P2 applied to the non-inverting input terminal of the first operational amplifier 34 to reduce the potential PO1 at the connection point P1, thus increasing the voltage difference across the resistor 24. This increases the charging current applied to the gate of the switching element S*#, resulting in the gate voltage Vge being corrected to increase.

The voltage correcting unit 58g will turn off the switch 30, which is in an on state, at a suitable timing. For example, in the first embodiment, the voltage correcting unit 58g will turn off the switch 34 in response to the start of the soft-turnoff task. In step S20, the voltage correcting unit 58g maintains the switch 30 in the on state until start of the soft-turnoff task, but can perform on-off operations of the switch 30 to perform feedback control of the gate voltage Vge to the clamp voltage $V_{clamp}$.

Otherwise, upon determination that the completion flag F stored therein beforehand is set to 1 (NO in step S16), the voltage correcting routine proceeds to step S22. In addition, upon determination that the gate voltage Vge is more than the low-side threshold voltage VjdeL (NO in step S18), the voltage correcting unit 58*g* determines that the gate voltage Vge is not deviated downwardly from the clamp voltage $V_{clamp}$. Then, the voltage correcting routine proceeds to step S22. In addition, when the operation in step S20 is completed, the voltage correcting routine proceeds to step S22.

In step S22, the voltage correcting unit 58*g* determines whether the value of the counter Tcnt is equal to or more than the clamp-filter time $T_{clamp}$.

Upon determination that the value of the counter Tcnt is less than the clamp-filter time $T_{clamp}$ (NO in step S22), the voltage correcting routine proceeds to step S14. Otherwise, upon determination that the value of the counter Tcnt is equal to or more than the clamp-filter time $T_{clamp}$ (YES in step S22), the voltage correcting routine proceeds to step S24. In step S24, the voltage correcting unit 58*g* stops the output of the enabling signal to the second operational amplifier 42, thus terminating the clamping task.

When the operation in step S14 or step S24 is completed, the voltage correcting routine proceeds to step S26. In addition, upon determination that the clamping task has not just started (NO in step S10), the voltage correcting routine proceeds to step S26.

In step S26, the voltage correcting unit 58*g* determines whether the output signal Sig of the comparator 54 has been in the logical high level for the short-circuit filter time Tsc. Upon determination that the output signal Sig of the comparator 54 has been in the logical high level for the short-circuit filter time Tsc (YES in step 26), the voltage correcting routine proceeds to step S28. The operation in step S26 and the components 54 and 56 serve as, for example, a current determining module for determining whether the output signal Sig of the comparator 54 has been in the logical high level for the short-circuit filter time Tsc.

In step S28, the voltage correcting unit 58*g* turns on the soft-turnoff switching element 48, and turns off each of the constant-current switching element 26, the discharging switching element 38, and the clamping switching element 40. The soft-turnoff switching element 48 and the turn-on operation of the soft-turnoff switching element 48 serve as, for example, a forced-turnoff module configured to forcibly turn off the switching element S#. In step S28, the voltage correcting unit 58*g* also performs the task of outputting the fail-safe signal FL to the controller 14 via the terminal T9 and the interface 18. Note that, in step S28, if the clamping task has been terminated, it is unnecessary for the voltage correcting unit 58*g* to turn off the clamping switching element 40.

When it is determined that the output signal Sig of the comparator 54 has not been in the logical high level for the short-circuit filter time Tsc (NO in step 26), or when the operation in step S28 is completed, the voltage correcting unit 58*g* terminates the voltage correcting routine.

Next, let us describe in detail the voltage correcting task using FIG. 7.

FIGS. 7A to 7E are a joint timing chart schematically illustrating an example of specific operations of the voltage correcting task by the drive controller 58 of the drive unit DO.

Figure 7A:
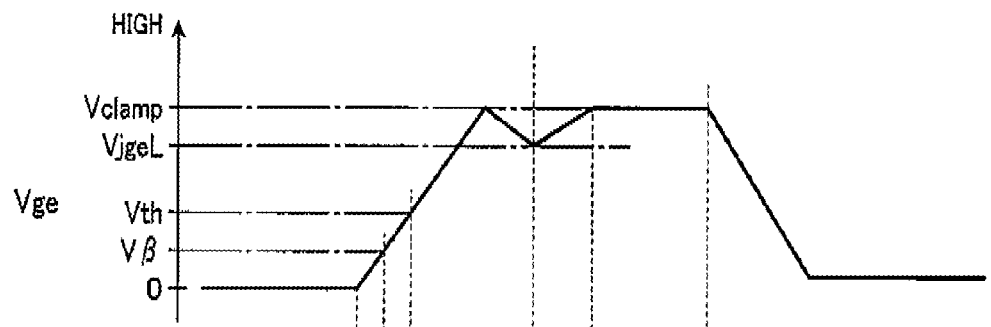
FIGS. 7A to 7E are a joint timing chart schematically illustrating an example of specific operations of a voltage correcting task by the drive controller of each drive unit.
Figure 7B:
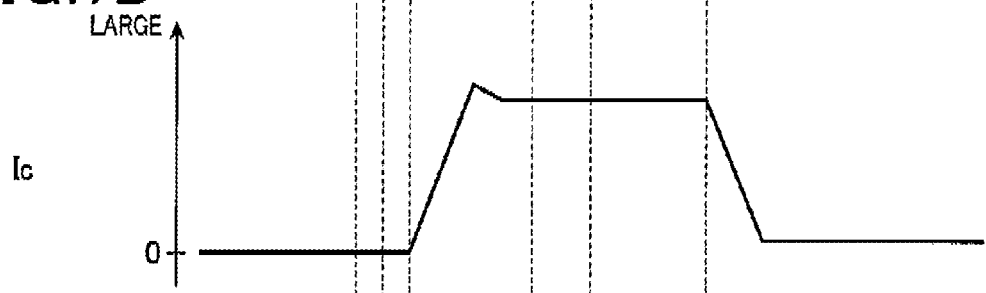
Figure 7C:
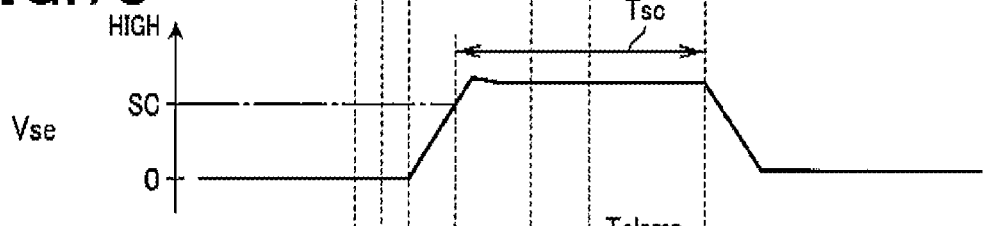
Figure 7D:
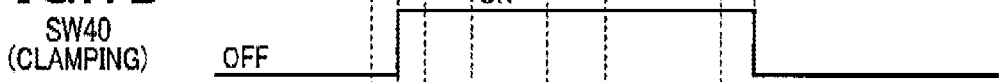
Figure 7E:
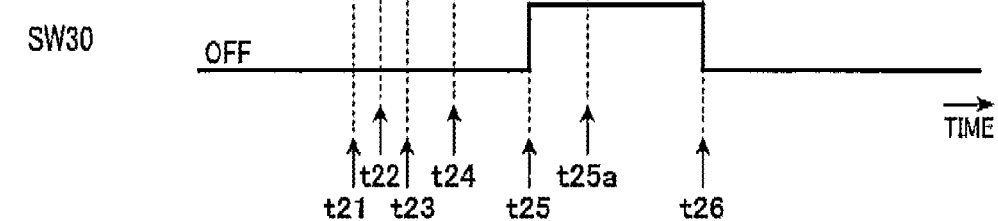

Specifically, FIG. 7A schematically illustrates an example of how the gate voltage Vge varies, FIG. 73 schematically illustrates an example of how the collector current Ic varies, and FIG. 7C schematically illustrates an example of how the sense voltage Vse varies. In addition, FIG. 7D schematically illustrates an example of how the clamping switching element 40 is driven, and FIG. 7E schematically illustrates an example of how the switch 30 is driven.

Referring to FIG. 7, the gate voltage Vge starts increasing based on the charging task at time t21, and thereafter the clamping task is started at time t22. After the start of the clamping task, the gate voltage Vge reaches the threshold voltage Vth at time t23.

If the aforementioned magnetic coupling is generated so that the gate voltage Vge decreases, when the preset period Tα has elapsed since the time t22, the gate voltage Vge drops down to the low-side threshold voltage VjdeL at time t25. This causes the voltage correcting unit 58*g* to turn on the switch 30 (see the operation in step S20), resulting in an increase of the gate voltage Vge up to the clamp voltage $V_{clamp}$ at later time t25*a*. Because the gate voltage Vge is maintained to be equal to or higher than the low-side threshold voltage VjdeL, it is possible to prevent the collector current Ic from rapidly decreasing, thus preventing the sense voltage Vse from becoming lower than the short-circuit threshold voltage SC (see the period from the time t22 to time t26). Thus, when the short-circuit filter time Tsc has elapsed since the time t24 at which the sense voltage Vse increases to reach the short-circuit threshold voltage SC (see the time t26), the affirmative determination in step S26 is performed. This turns on the soft-turnoff switching element 48, thus performing the soft-turnoff task at the time t26 (see the operation in step S28), resulting in the switching element S*# being turned off slowly as compared to that being turned off via the discharging switching element 38.

As described above, the drive unit DU provided for each switching element S*# according to the first embodiment is configured to perform the voltage correcting task to turn on the switch 30 upon determination that the gate voltage Vge decreases down to the low-side threshold voltage VjdeL although the clamping task is being performed.

This configuration prevents the gate voltage Vge being deviated from the clamp voltage $V_{clamp}$ to thereby prevent the collector current Ic from rapidly decreasing, resulting in suppression of an increase of the collector-emitter voltage Vce, thus preventing an increase of the switching loss of the switching element S*#.

In addition, this configuration of the drive unit DU provided for each switching element S*# according to the first embodiment reliably performs the soft-turnoff task to thereby prevent an increase of the collector current Ic again, resulting in reliable protection of the switching element S*# against an overcurrent, i.e. a short-circuit current due to an upper-lower arm short-circuit.

Note that, as another approach to reduce a relatively large impact, on the gate voltage Ve, of some components of the floating inductance Lg existing in the second conductive path connected to the gate of the switching element S*#, it could be possible to change the design of the switching element S*# to reduce the impact of magnetic coupling between these components and the floating inductance Lm. However, there might be many restrictions in such design changes.

In contrast, the drive unit DU provided for each switching element S*# according to the first embodiment makes it possible to reduce the impact of magnetic coupling between the floating inductances Lg and Lm on the gate voltage Vge without design changes of the switching element S*#.

Thus, in comparison to the approach based on design changes of the switching element S*#, it is possible to reduce design limitations of the switching element S*#.

Second Embodiment

A control system for controlling the motor-generator 10 according to a second embodiment of the present disclosure will be described with reference to FIG. 8.

The structure and/or functions of the control system according to the second embodiment are mainly identical to those of the control system according to the first embodiment except for the following points. So, the different points will be mainly described hereinafter.

The drive unit DU provided for each switching element S*# according to the second embodiment is configured to perform another approach to correct the gate voltage Vge in comparison to the approach according to the first embodiment.

Figure 8:
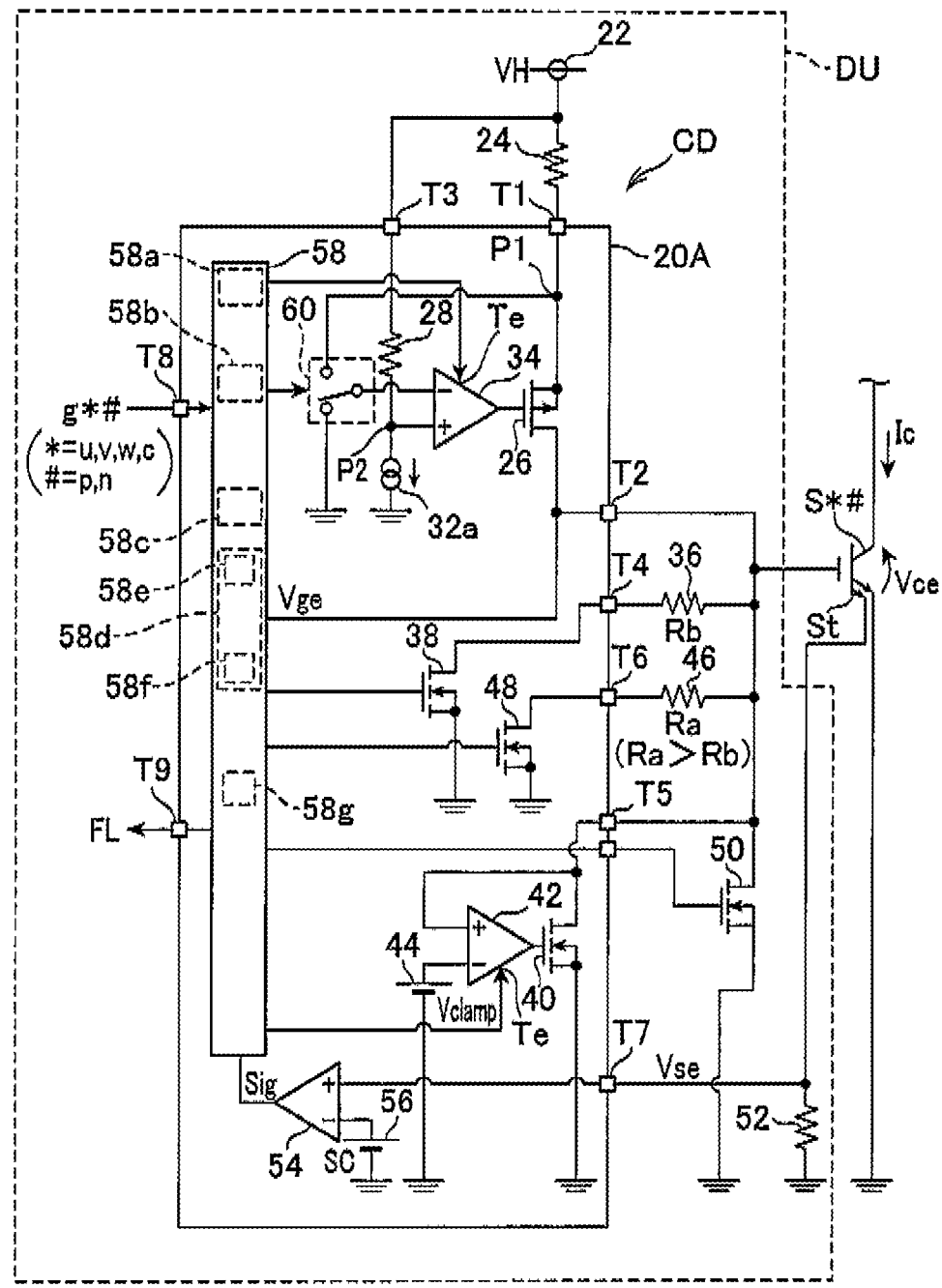
FIG. 8 is a circuit diagram schematically illustrating an example of the structure of each drive unit according to a second embodiment of the present disclosure.

FIG. 8 schematically illustrates an example of the structure of the drive unit DU provided for each switching element S*# according to the second embodiment.

Referring to FIG. 8, a drive IC 20A of the drive unit DU is designed such that the second constant current power source 32b and the switch 30 are eliminated in comparison to the configuration of the driver IC 20 according to the first embodiment.

Specifically, the drive IC 20A is comprised of a switch 60 connected to the drive controller 58. The inverting input terminal of the first operational amplifier 34 is connectable to selectively one of: the emitter of the switching element S*# via the common potential line; and the connection point P1 between the terminal T1 and the source of the charging switching element 26 via the switch 60.

That is, the drive controller 58 is operative to control the switch 60 such that the inverting input terminal of the first operational amplifier 34 is connected to either the emitter of the switching element S*# via the common potential line or the connection point P1. In the second embodiment, the drive controller 60 controls the switch 60 such that the inverting input terminal of the first operational amplifier 34 is connected to the connection point P1 in the normal mode of the drive controller 58.

Next, an example of the voltage correcting routine according to the second embodiment will be described hereinafter with reference to FIG. 6.

The operations in steps S10 to S18 of the voltage correcting unit 58g of the drive controller 58 according to the second embodiment are identical to those of the voltage correcting unit 58g according to the first embodiment.

When the determination in step S18 is affirmative, the voltage correcting unit 58g carries out the operation in step S20a to:

control the switch 60 such that the inverting input terminal of the first operational amplifier 34 is connected to the emitter of the switching element S*# via the common potential line, i.e. connected to the zero potential; and set the completion flag F to 1.

Specifically, the voltage correcting unit 58g sets the voltage applied to the inverting input terminal of the first operational amplifier 34 to zero if the gate voltage Vge is equal to or less than the low-side threshold voltage VjdeL. This pulls up the voltage at the connection point P1 between the terminal T1 and the source of the charging switching element 26 to the terminal voltage VH of the constant voltage power source 22. Thus, it is possible to apply the constant voltage VH to the gate of the switching element S*#, thus rapidly increasing the gate voltage Vge up to the terminal voltage VH, i.e. the upper limit of the gate voltage Vge. This configuration prevents the gate voltage Vge being deviated from the clamp voltage $V_{clamp}$, thus achieving the same effects as those achieved in the first embodiment.

Third Embodiment

A control system for controlling the motor-generator 10 according to a third embodiment of the present disclosure will be described with reference to FIGS. 9 to 12.

The structure and/or functions of the control system according to the third embodiment are mainly identical to those of the control system according to the first embodiment except for the following points. So, the different points will be mainly described hereinafter.

The drive unit DU provided for each switching element S*# according to the third embodiment is configured to perform a further approach to correct the gate voltage Vge in comparison to the approach according to the first embodiment.

Figure 9:
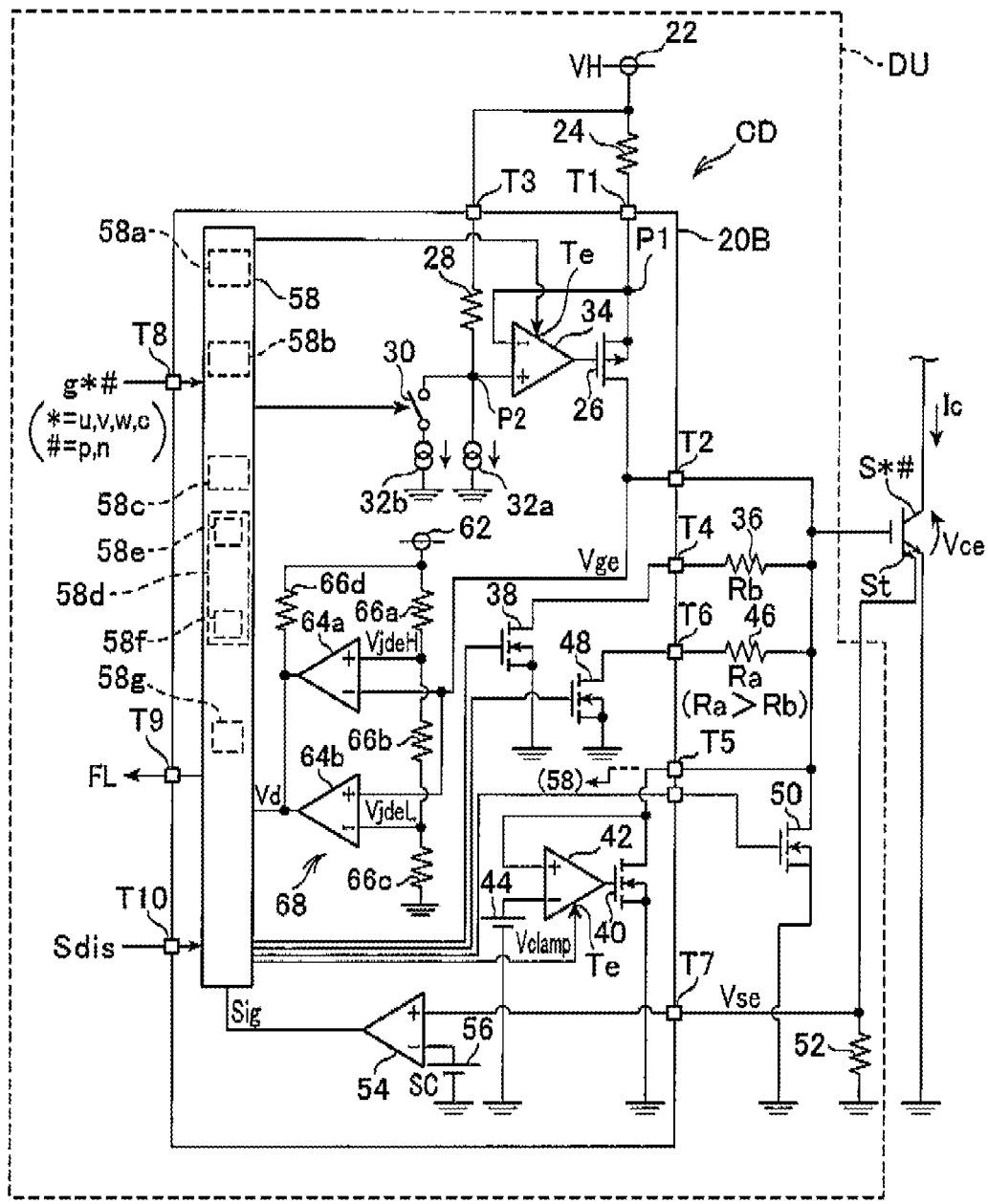
FIG. 9 is a circuit diagram schematically illustrating an example of the structure of each drive unit according to a third embodiment of the present disclosure.

FIG. 9 schematically illustrates an example of the structure of the drive unit DU provided for each switching element S*# according to the third embodiment. In the third embodiment, the comparator 54 will be referred to as a first comparator 54.

Referring to FIG. 9, a drive IC 20B of the drive unit DO is further comprised of a window comparator 68. The window comparator 68 is comprised of a constant voltage power source 62, a second comparator 64a, a third comparator 64b, and first to fourth resistors 66a to 66d. Specifically, each of the second and third comparators 64a and 64b has a non-inverting input terminal, an inverting input terminal, and an output terminal. The inverting input terminal of the second comparator 64a and the non-inverting input terminal of the third comparator 64b are commonly connected to the drain of the charging switching element 26 and to the second terminal T2. The non-inverting input terminal of the second comparator 64a is connected to the constant voltage power source 62 via the first resistor 66a. The inverting input terminal of the third comparator 64b is connected to the constant voltage power source 62 via a series-connection member comprised of series-connected first and second resistors 66a and 66b. The inverting input terminal of the third comparator 64b is also connected to the emitter of the switching element S*# via the third resistor 66c and the common potential line.

The output terminal of each of the second and third comparators 64a and 64b is connected to the constant voltage power source 62 via the fourth resistor 66d, and to the drive controller 58.

In the third embodiment, setting the resistances of the respective first to third resistors 66a to 66c establishes:

a voltage applied to the inverting input terminal of the third comparator 64b based on the constant voltage power source 62 to the low-side threshold voltage VjdeL; and a voltage applied to the non-inverting input terminal of the second comparator 64a based on the constant voltage power source 62 to a high-side threshold voltage VjdeH higher than the low-side threshold voltage VjdeL.

In the third embodiment, the high-side threshold voltage VjdeH is set to a value obtained by adding a second preset value ΔVH greater than zero to the clamp voltage $V_{clamp}$. The second preset value ΔVH is set such that whether the gate voltage Vge deviates upward from the clamp voltage $V_{clamp}$ can be reliably determined without excessive rise of the gate voltage Vge relative to the clamp voltage $V_{clamp}$. For example, the second preset value ΔVH is set to a value as low as possible.

The configuration and setting of the window comparator 68 determines that the logical level of an output signal Vd thereof is the logical high level only when:

the gate voltage Vge input to the inverting input terminal of the second comparator 64a and the non-inverting input terminal of the third comparator 64b as an input signal is higher than the low-side threshold voltage VjdeL and lower than the high-side threshold voltage VjdeH.

The configuration of the drive unit DU aims to address a case where magnetic coupling is generated between:

a floating inductance existing in the first conductive path passing through the conductive path between the collector and emitter of a switching element S*#; and a floating inductance existing in the second conductive path connected to the gate of the same switching element S*# and to the drain of the clamping switching element 40.

Specifically, the circuit configuration of the drive unit DU may cause magnetic coupling between the floating inductance Lm and the floating inductance Lg, which increases the gate voltage Vge in opposition to magnetic coupling therebetween that decreases the gate voltage Vge.

Let us fully describe the magnetic coupling according to the third embodiment.

An increase of the collector current Ic of the low-side switching element S*n due to an upper-lower arm short-circuit generates a self-induced EMF across the floating inductance Lm to have a direction cancelling the increase of the collector current Ic. Because the floating inductance Lg is magnetically coupled to the floating inductance Lm, a similar self-induced EMF is generated across the floating inductance Lg to have a direction cancelling the increase of the collector current Ic, i.e. a direction to cause positive charges to be transferred to the gate of the low-side switching element S*#. The transfer of the positive charges to the gate of the low-side switching element S*# causes the gate voltage Vge to greatly increase. Thus, if no measure to the increase of the gate voltage Vge were provided in the drive unit DU, the gate voltage Vge might be deviated upwardly from the clamp voltage $V_{clamp}$. This might make it difficult to immediately reduce the gate voltage Vge down to the clamp voltage $V_{clamp}$ although the sense voltage Vse exceeded the short-circuit threshold voltage SC. This might result in a difficulty immediately limiting an increase of the level of the collector current Ic, resulting in reduction of the reliability of the switching element S*#.

In view of these circumstances, the drive unit DU provided for each switching element S*# according to the third embodiment is equipped with the drive IC 20B as configured set forth above. As described above, the circuit configuration of the drive unit DU may cause one of: magnetic coupling, referred to as voltage-drop magnetic coupling, between the floating inductance Lm and the floating inductance Lg, which decreases the gate voltage Vge; and magnetic coupling, referred to as voltage-rise magnetic coupling, therebetween, which increases the gate voltage Vge.

For this reason, the drive IC 20B according to the third embodiment is configured such that an external signal Sdis is input to the drive controller 58 via the terminal T10 of the drive IC 20B. The external signal Sdis permits the drive controller 58 to determine which of a first voltage correction and a second voltage correction should be performed. The first voltage correction is to reduce the impact of the voltage-drop magnetic coupling on the switching element S*#, and the second voltage correction task is to reduce the impact of the voltage-rise magnetic coupling on the switching element S*#. The terminal T120 serves as, for example, an input module to which the external signal Bis input.

Figure 10A:
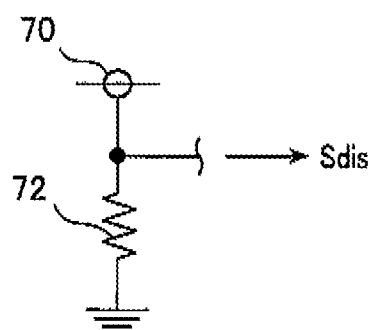
FIG. 10A is a circuit diagram schematically illustrating a first external circuit for performing a first voltage correction for addressing voltage-drop magnetic coupling according to the third embodiment.

In order to make the drive controller 58 perform the first voltage correction, a first external circuit illustrated in FIG. 10A is added to the drive IC 20B. Referring to FIG. 10A, the first external circuit is comprised of a constant voltage power source 70 and a pull-down resistor 72. A first end of the pull-down resistor 72 is connected to the constant voltage power source 70, and a second end thereof is connected to the emitter of the switching element S*# via the common potential line. The connection point between the constant voltage power source 70 and the pull-down resistor 72 is connected to the terminal T10 of the drive IC 20B. The first external circuit is operative to output the external signal Sdis having a logical low level of, for example, 0 V.

Figure 10B:
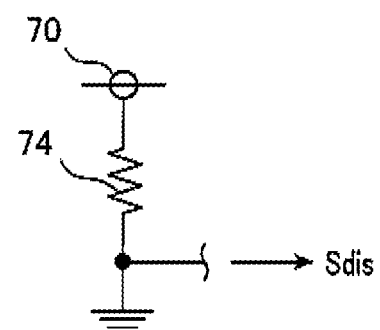
FIG. 10B is a circuit diagram schematically illustrating a second external circuit for performing a second voltage correction for addressing voltage-rise magnetic coupling according to the third embodiment.

In order to make the drive controller 58 perform the second voltage correction, a second external circuit illustrated in FIG. 10B is added to the drive IC 20B. Referring to FIG. 10S, the second external circuit is comprised of a constant voltage power source 70 and a pull-up resistor 74. A first end of the pull-up resistor 74 is connected to the constant voltage power source 70, and a second end thereof is connected to the emitter of the switching element S*# via the common potential line. The connection point between the pull-up resistor 74 and the emitter of the switching element S*# is connected to the terminal T10 of the drive IC 20B. The second external circuit is operative to output the external signal Sdis having a logical high level of, for example, a terminal voltage of the constant voltage power source 70.

An example of a voltage correcting routine for the voltage correcting task including the first and second voltage corrections will be described hereinafter with reference to FIG. 11. Steps in the routine illustrated in FIG. 11 identical to corresponding steps in the routine illustrated in FIG. 6, to which like reference characters are assigned, are omitted or simplified in description to avoid redundant description. Note that the drive controller 58 of each drive unit DU can be configured as a programmed logic unit, a hard-wired logic unit, or the combination of hardwired-logic and programmed-logic hybrid units, and can repeatedly carry out the routine, i.e. the voltage correcting routine, every preset cycle as an example.

Figure 11:
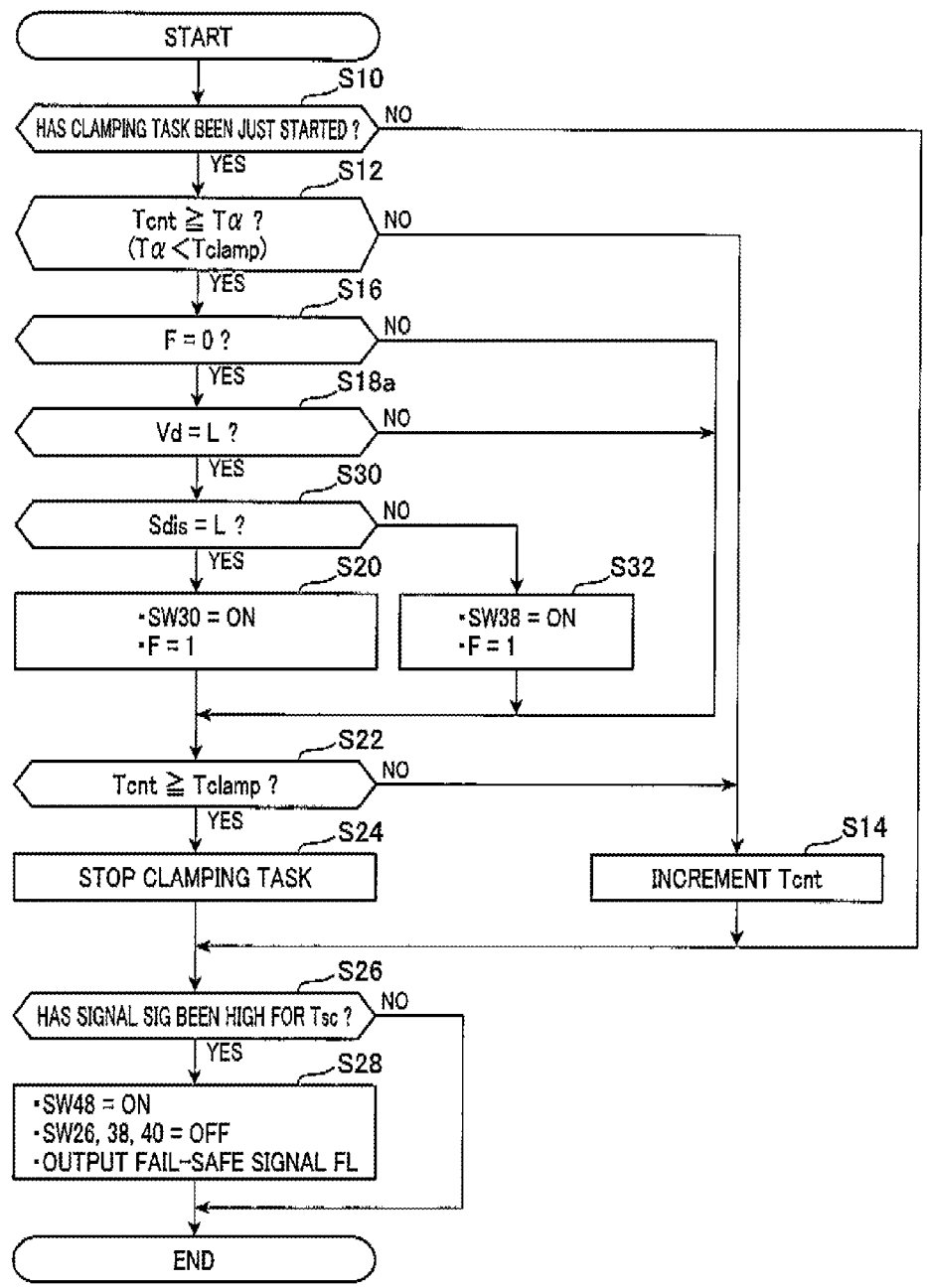
FIG. 11 is a flowchart schematically illustrating an example of a voltage correcting routine carried out by each drive unit of the control system according to the third embodiment.

Referring to FIG. 11, the operations in steps S10 to S16 of the voltage correcting unit 58g of the drive controller 58 according to the third embodiment are identical to those of the voltage correcting unit 58g according to the first embodiment. Note that the operation in step S12 aims to increase the accuracy of determining whether the gate voltage Vge deviates downwardly or upwardly from the clamp voltage $V_{clamp}$ in step S18a described later for the same reasons as the operation in step S12.

When the determination in step S16 is affirmative, the voltage correcting unit 58g carries out the operation in step S18a to determine whether the output signal Vd of the window comparator 68 is the logical low level. As described above, the logical level of the output signal Vd of the window comparator 68 is the logical high level only when the gate voltage Vge input to the inverting input terminal of the second comparator 64a and the non-inverting input terminal of the third comparator 64b is higher than the low-side threshold voltage VjdeL and lower than the high-side threshold voltage VjdeH.

For this reason, the operation in step S18a aims to determine whether the gate voltage Vge is equal to or less than the low-side threshold voltage VjdeL, is equal to or more than the high-side threshold voltage VjdeH, or is within the range from the low-side threshold voltage VjdeL and the high-side threshold voltage VjdeH inclusive. This determination means whether the gate voltage Vge deviates downwardly or upwardly from the clamp voltage $V_{clamp}$, or the gate voltage Vge is not deviated therefrom.

When it is determined that the logical level of the output signal Vd of the window comparator 68 is the logical low level, the voltage correcting unit 58g determines that the gate voltage Vge is equal to or less than the low-side threshold voltage VjdeL, or is equal to or more than the high-side threshold voltage VjdeH (YES in step S18a). Then, the voltage correcting unit 58g determines that the gate voltage Vge deviates downwardly or upwardly from the clamp voltage $V_{clamp}$, and determines whether the external signal Sdis has the logical low level in step S30.

Upon determination that the external signal Sdis has the logical low level (YES in step S30), the voltage correcting unit 58g determines that the first voltage correction to reduce the impact of the voltage-drop magnetic coupling on the switching element S*# should be performed. Then, the voltage correcting unit 58g carries out the operation in step S20 to turn on the switch 30, and set the completion flag F to 1 set forth above.

Otherwise, upon determination that the external signal Sdis has the logical high level (NO in step S30), the voltage correcting unit 58g determines that the second voltage correction to reduce the impact of the voltage-rise magnetic coupling on the switching element S*# should be performed. That is, in the third embodiment, the operation in step S18a and the operation in step S30 serve as, for example, the determining module.

Then, the voltage correcting unit 58g carries out the operation in step S32 to turn on the discharging switching element 38, and set the completion flag F to 1. The operation in step S32 aims to increase the capability of draining the amount of electric charge from the gate thereof, thus decreasing the gate voltage Vge to be close to the clamp voltage $V_{clamp}$.

Note that, the discharging switching element 38, which has been changed to the on state in step S32, can be turned off by the voltage correcting unit 58g in response to, for example, the start of the soft-turnoff task. In step S32, the voltage correcting unit 58g can perform on-off operations of the discharging switching element 38 to perform feedback control of the gate voltage Vge to the clamp voltage $V_{clamp}$.

Upon determination that: the determination in step S16 is negative; the output signal Vd of the window comparator 68 is not the logical low level (NO in step S18a); the operation in step S20 is completed, or the operation in step S32 is completed, the voltage correcting unit 58g executes the operation in step S22 described above.

The remaining operations illustrated in FIG. 11 are identical to those illustrated in FIG. 6.

Next, let us describe in detail the second voltage correction for reducing the impact of the voltage-rise magnetic coupling on the switching element S*# using FIG. 12.

Figure 12A:
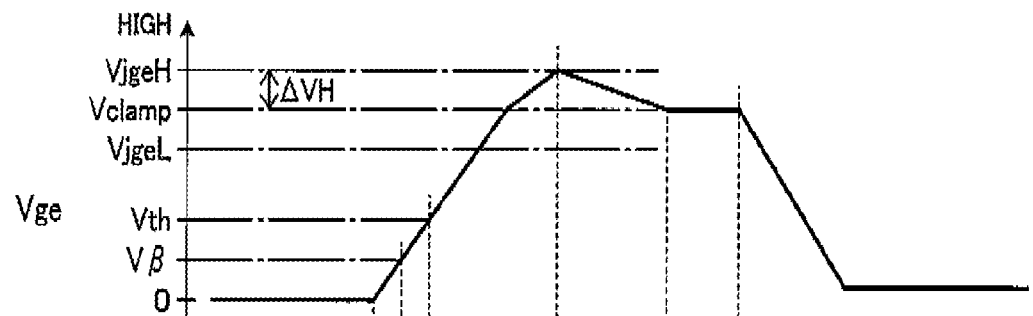
FIGS. 12A to 12E are a joint timing chart schematically illustrating an example of specific operations of the second voltage correction by the drive controller of each drive unit according to the third embodiment.
Figure 12B:
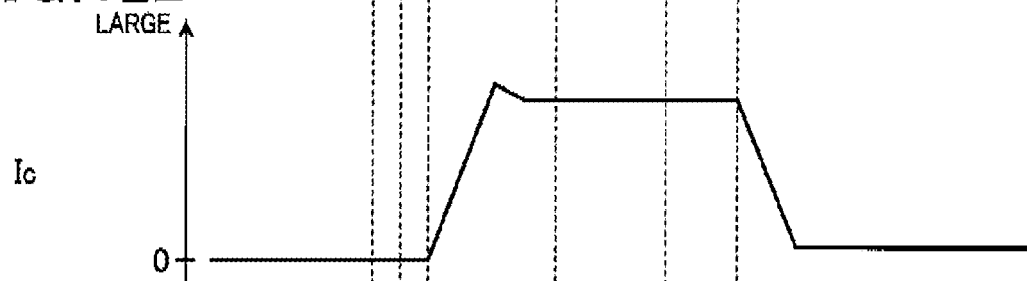
Figure 12C:
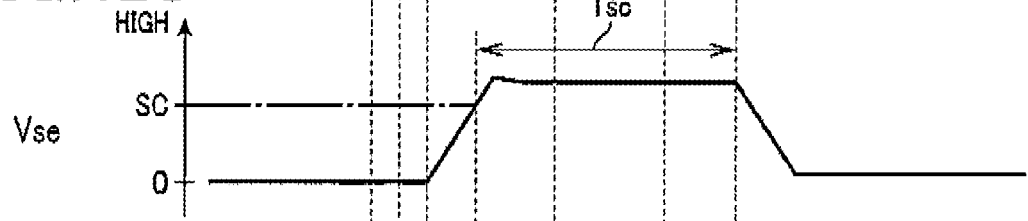
Figure 12D:
Figure 12E:
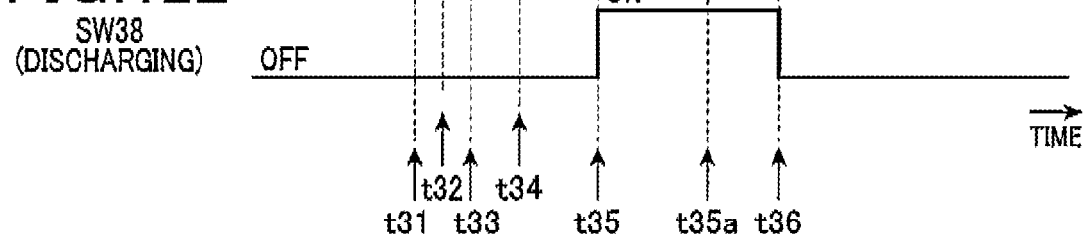

FIGS. 12A to 12E are a joint timing chart schematically illustrating an example of specific operations of the second voltage correction by the drive controller 58 of the drive unit DU. FIGS. 12A to 12D correspond to FIGS. 7A to 7D, respectively, and FIG. 12E schematically illustrates an example of how the discharging switching element 38 is driven.

Referring to FIG. 12, the gate voltage Vge starts increasing based on the charging task at time t31, and thereafter the clamping task is started at time t32. After the start of the clamping task, the gate voltage Vge reaches the threshold voltage Vth at time t33.

If the aforementioned voltage-rise magnetic coupling is generated so that the gate voltage Vge increases, when the preset period Tα has elapsed since the time t32, the gate voltage Vge rises up to the high-side threshold voltage VjdeH at time t35. This causes the voltage correcting unit 58g to turn on the discharging switching element 38 (see the operation in step S20a), resulting in rapid decrease of the gate voltage Vge down to the clamp voltage $V_{clamp}$ at later time t35a.

In contrast, if the second voltage correction were not performed, the time required for the gate voltage Vge to decrease down to the clamp voltage $V_{clamp}$ could be longer, and/or it could be difficult to reduce the gate voltage Vge down to the clamp voltage $V_{clamp}$ until the soft-turnoff task is performed.

As described above, the drive unit DU for each switching element S*# according to the third embodiment is configured to adjust the gate voltage Vge to be close to the clamp voltage $V_{clamp}$ even if the voltage-rise magnetic coupling to increase the gate voltage Vge is generated in addition to the voltage-drop magnetic coupling described in the first embodiment is generated. For this reasons, it is possible to rapidly limit the level of the corrector current Ic while the voltage-rise magnetic coupling is generated, thus preventing the reliability of the switching element S*3 from being reduced.

The drive unit DU for each switching element S*# according to the third embodiment uses the discharging switching element 38, which is used to discharge the gate of the switching element S*# in the normal mode of the drive controller 58, to perform the second voltage correction. This configuration results in reduction of the number of additional components required to perform the second voltage correction in addition to the first voltage correction.

Moreover, in the first embodiment, the voltage correcting unit 58g of the drive controller 58 is capable of performing both the first voltage correction to reduce the impact of the voltage-drop magnetic coupling on the switching element S*# and the second voltage correction to reduce the impact of the voltage-rise magnetic coupling on the switching element S*#. Thus, it is possible to prevent an increase of the drive unit DU in size in comparison to the configuration that a drive unit equipped with separated voltage correcting units for performing the respective first and second voltage corrections.

Fourth Embodiment

A control system for controlling the motor-generator 10 according to a fourth embodiment of the present disclosure will be described with reference to FIGS. 13 and 14.

The structure and/or functions of the control system according to the fourth embodiment are mainly identical to those of the control system according to the first embodiment except for the following points. So, the different points will be mainly described hereinafter.

The drive unit DU provided for each switching element S*# according to the fourth embodiment is configured to perform another approach to determine whether the gate voltage Vge deviates from the clamp voltage $V_{clamp}$ in comparison to the approach according to the first embodiment.

Figure 13:
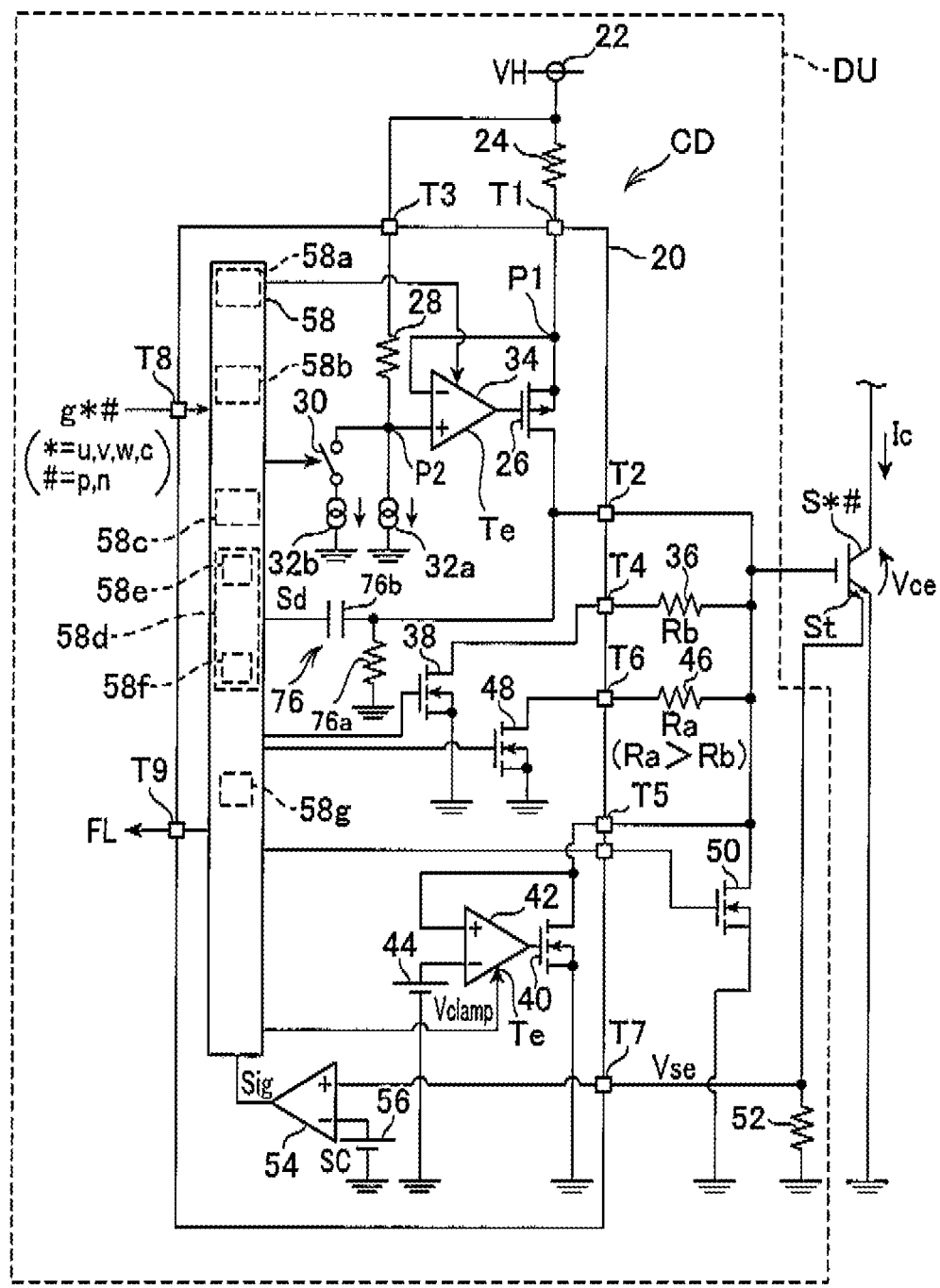
FIG. 13 is a circuit diagram schematically illustrating an example of the structure of each drive unit according to a fourth embodiment of the present disclosure.

FIG. 13 schematically illustrates an example of the structure of the drive unit DU provided for each switching element S*# according to the fourth embodiment.

Referring to FIG. 13, a drive IC 20C of the drive unit DU further includes a differentiator 76 comprised of a resistor 75a and a capacitor 76b. Specifically, a first end of the resistor 76a is connected to one electrode of the capacitor 76b, and a second end of the resistor 75a is connected to the common potential line. The connection point between the resistor 76a and the capacitor 76b, which serves as an input terminal of the differentiator 76 is connected to the terminal T2. The other electrode of the capacitor 76b, which serves as an output terminal of the differentiator 76 is connected to the drive controller 58. The differentiator 76 is operative to output a signal directly proportional to the rate Sd of decrease, i.e. the time derivative, of the gate voltage Vge input thereto via the input terminal. Specifically, the differentiator 76 outputs the rate Sd of decrease of the gate voltage Vge to the drive controller 58.

An example of a voltage correcting routine for a voltage correcting task according to the fourth embodiment will be described hereinafter with reference to FIG. 14. Steps in the routine illustrated in FIG. 14 identical to corresponding steps in the routine illustrated in FIG. 6, to which like reference characters are assigned, are omitted or simplified in description to avoid redundant description. Note that the drive controller 58 of each drive unit DU can be configured as a programmed logic unit, a hard-wired logic unit, or the combination of hardwired-logic and programmed-logic hybrid units, and can repeatedly carry out the routine, i.e. the voltage correcting routine, every preset cycle as an example.

Figure 14:
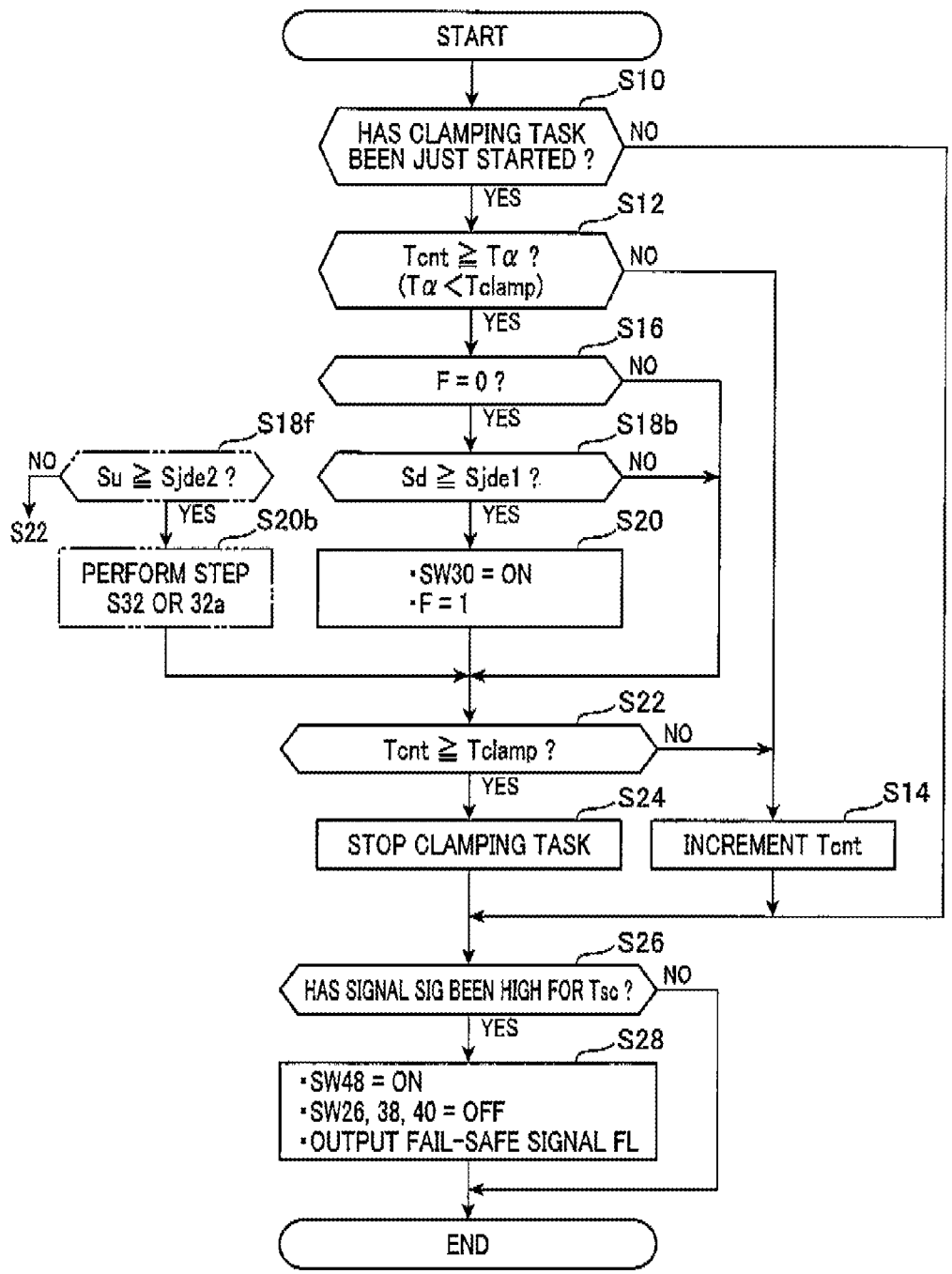
FIG. 14 is a flowchart schematically illustrating an example of a voltage correcting routine carried out by each drive unit of the control system according to the fourth embodiment.

Referring to FIG. 14, the operations in steps S10 to S16 of the voltage correcting unit 58g of the drive controller 58 according to the fourth embodiment are identical to those of the voltage correcting unit 58g according to the first embodiment.

When the determination in step S16 is affirmative, the voltage correcting unit 58g carries out the operation in step S18b to determine whether the rate Sd of decrease of the gate voltage Vge is equal to or lower than a preset rate Sjde1; the preset rate Sjde1 is greater than zero. The rate Sd of decrease of the gate voltage Vge represents a future transition of the gate voltage Vge. Thus, the operation in step S18b aims to determine whether the gate voltage Vge deviates downwardly from the clamp voltage $V_{clamp}$. In the fourth embodiment, the preset rate Sjde1 is set such that whether the gate voltage Vge deviates downwardly from the clamp voltage $V_{clamp}$ can be immediately determined.

When it is determined that the rate Sd of decrease of the gate voltage Vge is equal to or lower than the preset rate Sjde1 (YES in step S18b), the voltage correcting unit 58g determines that the gate voltage Vge deviates downwardly from the clamp voltage $V_{clamp}$. Then, the voltage correcting unit 58g carries out the operation in step S20 to turn on the switch 30, and set the completion flag F to 1. Otherwise, when it is determined that the rate Sd of decrease of the gate voltage Vge is higher than the preset rate Sjde1 (YES in step S18b), the voltage correcting unit 58g determines that the gate voltage Vge is not deviated downwardly from the clamp voltage $V_{clamp}$. Then, the voltage correcting routine proceeds to step S22.

The remaining operations illustrated in FIG. 14 are identical to those illustrated in FIG. 6.

As described above, the drive unit DU for each switching element S*# according to the fourth embodiment is capable of properly determining whether the gate voltage Vge deviates downwardly from the clamp voltage $V_{clamp}$.

In addition, the drive unit DU for each switching element S*# according to the fourth embodiment uses the rate Sd of decrease of the gate voltage Vge as a parameter for determining whether the gate voltage Vge deviates downwardly from the clamp voltage $V_{clamp}$. Because the rate Sd of decrease of the gate voltage Vge shows the future transition of the gate voltage Vge, the drive controller 58 is able to easily and rapidly determine whether the gate voltage Vge deviates downwardly from the clamp voltage $V_{clamp}$ as a function of the rate Sd of decrease of the gate voltage Vge. Thus, the configuration of the drive unit DU for each switching element S*# according to the fourth embodiment can more quickly determine whether the gate voltage Vge deviates downwardly from the clamp voltage $V_{clamp}$ than the same timing set in each of the first to third embodiments. For example, in order to specifically make earlier the timing of whether the gate voltage Vge deviates downwardly from the clamp voltage $V_{clamp}$, the configuration of the drive unit DU for each switching element S*# according to the fourth embodiment is capable of shortening the preset period Tα in comparison to the preset period To: used in each of the first to third embodiments.

Fifth Embodiment

A control system for controlling the motor-generator 10 according to a fifth embodiment of the present disclosure will be described with, reference to FIGS. 15 and 16.

The structure and/or functions of the control system according to the fifth embodiment are mainly identical to those of the control system according to the third embodiment except for the following points. So, the different points will be mainly described hereinafter.

The drive unit DU provided for each switching element S*# according to the fifth embodiment is configured to perform a further approach to determine whether the gate voltage Vge deviates from the clamp voltage $V_{clamp}$ in comparison to the approach according to the third embodiment.

As illustrated by a phantom line in FIG. 9, in the drive unit DU provided for each switching element S*# according to the fifth embodiment, the terminal T5 is connected to the drive controller 58, so that the drive controller 58 is capable of measuring a clamp current $I_{clamp}$ flowing through the clamping switching element 40. In addition, in the drive unit DU provided for each switching element S*# according to the fifth embodiment, the drive IC 20 is comprised of no window comparator 68 and terminal T10 as compared with the drive unit DU 20 according to the third embodiment.

An example of a voltage correcting routine according to the fifth embodiment will be described hereinafter with reference to FIG. 15. Steps in the routine illustrated in FIG. 15 identical to corresponding steps in the routine illustrated in FIG. 11, to which like reference characters are assigned, are omitted or simplified in description to avoid redundant description. Note that the drive controller 58 of each drive unit DU can be configured as a programmed logic unit, a hard-wired logic unit, or the combination of hardwired-logic and programmed-logic hybrid units, and can repeatedly carry out the routine, i.e. the voltage correcting routine, every preset cycle as an example.

Figure 15:
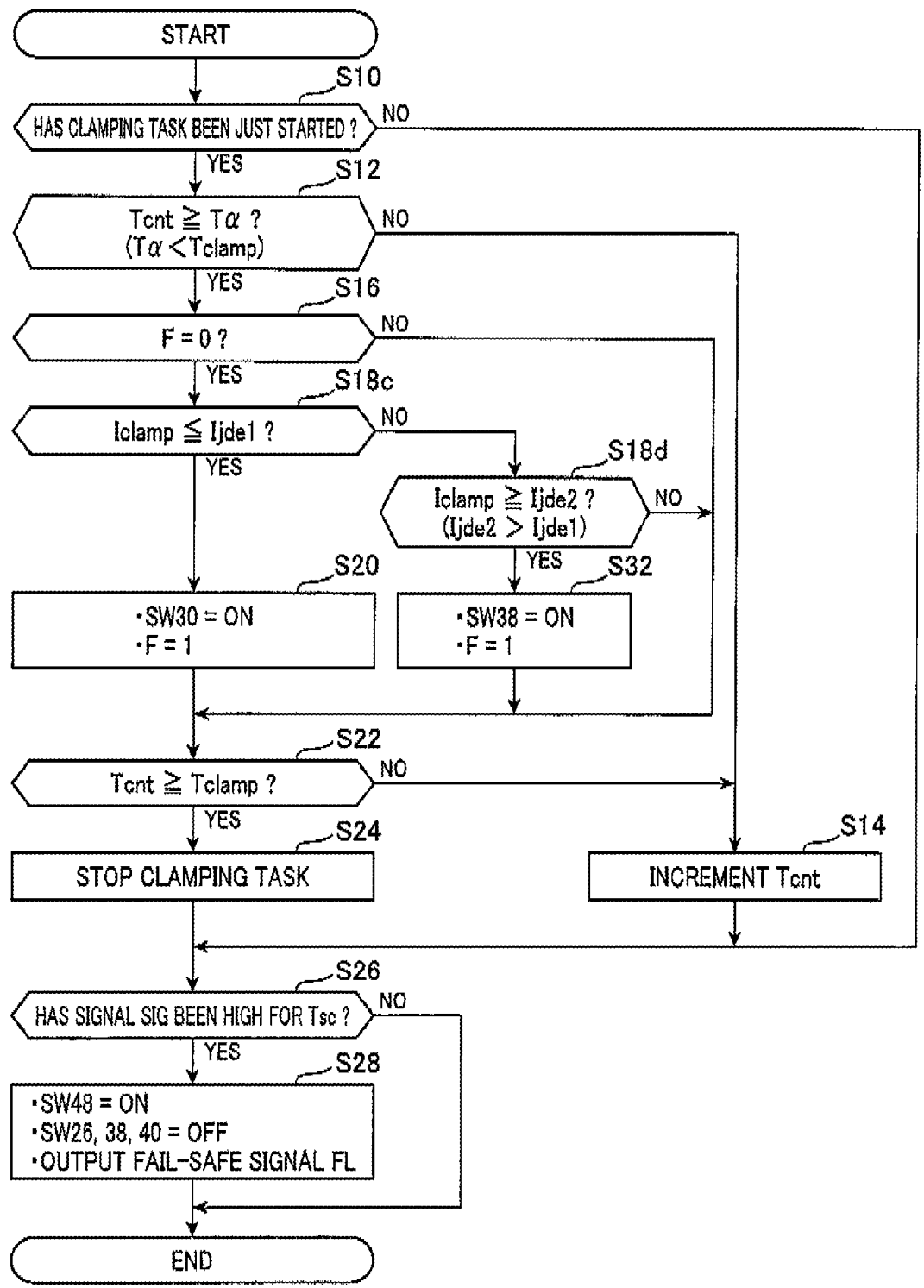
FIG. 15 is a flowchart schematically illustrating an example of a voltage correcting routine carried out by each drive unit of the control system according to a fifth embodiment of the present disclosure.

Referring to FIG. 15, the operations in steps S10 to S16 of the voltage correcting unit 58g of the drive controller 58 according to the fifth embodiment are identical to those of the voltage correcting unit 58g according to the third embodiment. When the determination in step S16 is affirmative, the voltage correcting unit 58g carries out the operation in step S18c to determine whether the clamp current $I_{clamp}$ is equal to or lower than a first preset value Ijde1. The operation in step S18c aims to determine whether the gate voltage Vge deviates downwardly from the clamp voltage $V_{clamp}$.

How to determine whether the gate voltage Vge deviates downwardly from the clamp voltage $V_{clamp}$ based on determination of whether the clamp current $I_{clamp}$ is equal to or lower than the first preset current Ijde1 in step S18c will be described hereinafter with reference to FIG. 16. FIGS. 16A to 16C are a joint timing chart, each of which schematically illustrates an example of how the gate voltage Vge and the clamp current $I_{clamp}$ vary while a short-circuit current is flowing through the switching element S*#. Specifically, FIG. 16A schematically illustrates how the gate voltage Vge and the clamp current $I_{clamp}$ vary if magnetic couplings do not have an impact on the gate voltage Vge, and FIG. 16B schematically illustrates how the gate voltage Vge and the clamp current $I_{clamp}$ if the voltage-drop magnetic occurs. FIG. 16C schematically illustrates how the gate voltage Vge and the clamp current $I_{clamp}$ vary if the voltage-rise magnetic coupling occurs.

As illustrated in FIG. 16A, if magnetic couplings do not have an impact on the gate voltage Vge, the clamp current $I_{clamp}$ is substantially kept at a preset value Im while the gate voltage Vge is clamped to the clamp voltage $V_{clamp}$ during execution of the clamping task. The preset value Im is substantially identical to a constant current supplied to the clamping switching element 40 via the constant-current switching element 26.

In contrast, if the voltage-drop magnetic coupling occurs, as illustrated in FIG. 16B, the clamp current $I_{clamp}$ starts decreasing at time t41 when the gate voltage Vge starts decreasing due to the voltage-drop magnetic coupling. Setting the first preset value Ijde1 to be less than the preset value Im and more than 0, that is, to be slightly lower than the preset value Im, permits determination of whether the gate voltage Vge deviates downwardly from the clamp voltage $V_{clamp}$.

Returning to FIG. 15, upon determination that the clamp current $I_{clamp}$ is equal to or lower than the first preset value Ijde1 (YES in step S18c), the voltage correcting unit 58g determines that the gate voltage Vge deviates downwardly from the clamp voltage $V_{clamp}$. Then, the voltage correcting unit 58g carries out the operation in step S20 to turn on the switch 30, and set the completion flag F to 1.

Otherwise, upon determination that the clamp current $I_{clamp}$ is higher than the first preset value Ijde1 (NO in step S18c), the voltage correcting unit 58g carries out the operation in step S18d to determine whether the clamp current $I_{clamp}$ is equal to or higher than a second preset value Ijde2; the second preset value Ijde2 is set to be higher than the first preset value Ijde1. The operation in step S18d aims to determine whether the gate voltage Vge deviates upwardly from the clamp voltage $V_{clamp}$.

Specifically, if the voltage-rise magnetic coupling occurs, as illustrated in FIG. 16C, the clamp current $I_{clamp}$ starts increasing at time t51 when the gate voltage Vge starts increasing due to the voltage-rise magnetic coupling. Setting the second preset value Ijde2 to be more than the preset value Im, that is, to be slightly higher than the preset value Im, permits determination of whether the gate voltage Vge deviates upwardly from the clamp voltage $V_{clamp}$.

Upon determination that the clamp current $I_{clamp}$ is equal to or higher than the second preset value Ijde2 (YES in step S18d), the voltage correcting unit 58g determines that the gate voltage Vge deviates upwardly from the clamp voltage $V_{clamp}$. Then, the voltage correcting unit 58g carries out the operation in step S32 to turn on the discharging switching element 38, and set the completion flag F to 1. Otherwise, upon determination that the clamp current $I_{clamp}$ is lower than the second preset value Ijde2 (NO in step S18d), or the operation in step S20 or in step S32 is completed, the voltage correcting routine proceeds to step S22.

The remaining operations illustrated in FIG. 15 are identical to those illustrated in FIG. 11.

As described above, the drive unit DU for each switching element S*# according to the fifth embodiment is capable of properly determining whether the gate voltage Vge deviates downwardly or upwardly from the clamp voltage $V_{clamp}$.

Particularly, the drive unit DU for each switching element S*# according to the fifth embodiment makes it possible to perform the determinations without using window comparators 68 and external signals Sdis. This results in reduction of: the number of components added to the drive unit DU for performing the voltage correcting task; and the number of terminals of the drive IC 20 used to perform the voltage correcting task.

Sixth Embodiment

A control system for controlling the motor-generator 10 according to a sixth embodiment of the present disclosure will be described with reference to FIGS. 17 and 18.

The structure and/or functions of the control system according to the sixth embodiment are mainly identical to those of the control system according to the third embodiment except for the following points. So, the different points will be mainly described hereinafter.

The drive unit DU provided for each switching element S*# according to the sixth embodiment is configured to perform another approach to correct the gate voltage Vge if the voltage-rise magnetic coupling occurs in comparison to the approach according to the third embodiment.

An example of a voltage correcting routine according to the sixth embodiment will be described hereinafter with reference to FIG. 17. Steps in the routine illustrated in FIG. 17 identical to corresponding steps in the routine illustrated in FIG. 11, to which like reference characters are assigned, are omitted or simplified in description to avoid redundant description. Note that the drive controller 58 of each drive unit DU can be configured as a programmed logic unit, a hardwired logic unit, or the combination of hardwired-logic and programmed-logic hybrid units, and can repeatedly carry out the routine, i.e. the voltage correcting routine, every preset cycle as an example.

Figure 17:
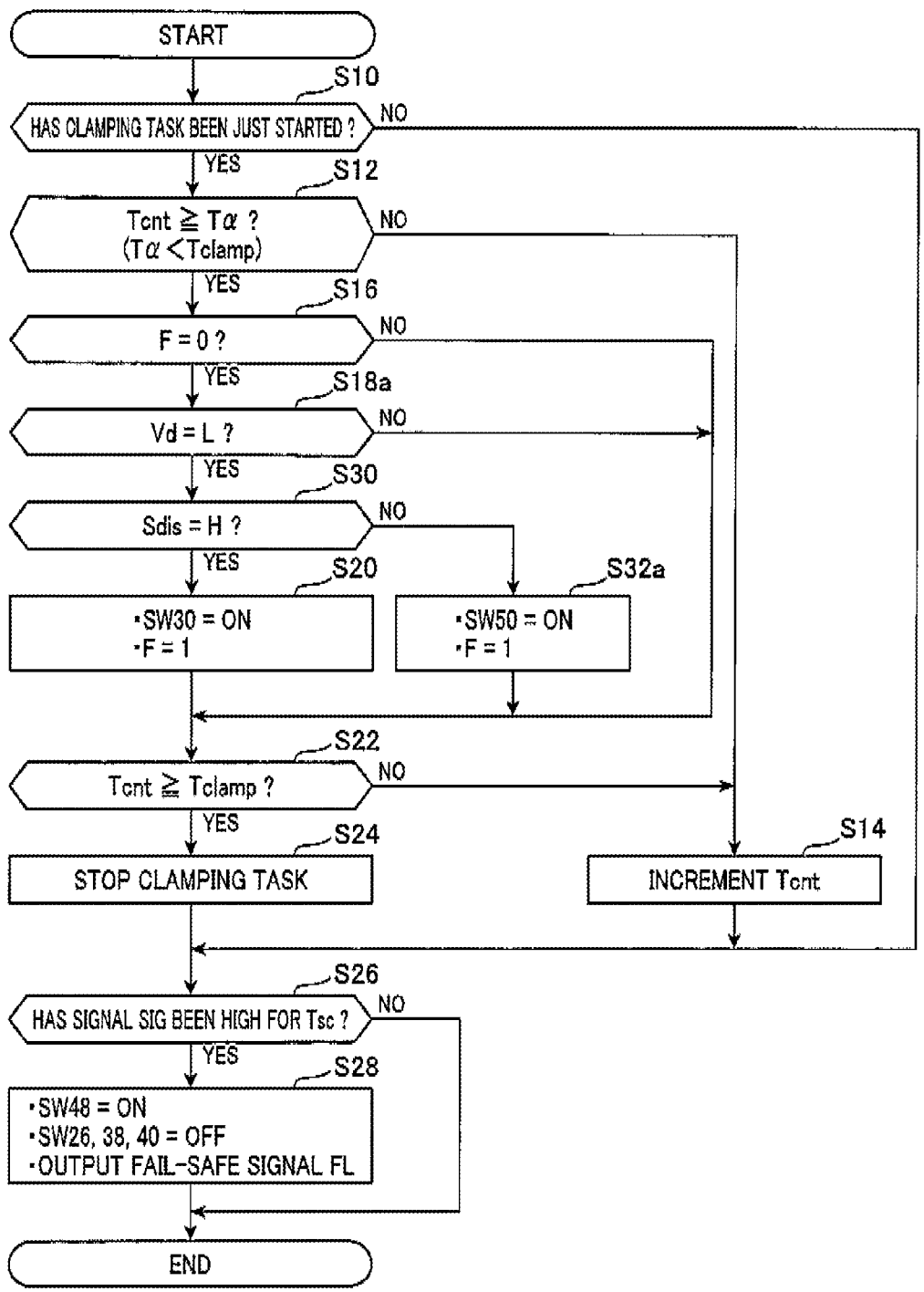
FIG. 17 is a flowchart schematically illustrating an example of a voltage correcting routine carried out by each drive unit of the control system according to the sixth embodiment.

Referring to FIG. 17, the operations in steps S10 to S18a of the voltage correcting unit 58g of the drive controller 58 according to the sixth embodiment are identical to those of the voltage correcting unit 58g according to the third embodiment. When the determination in step S18a is negative, the voltage correcting unit 58g determines that the second voltage correction to reduce the impact of the voltage-rise magnetic coupling on the switching element S*# should be performed.

Then, the voltage correcting unit 58g carries out the operation in step S32a to turn on the off-state holding switching element 50, and set the completion flag F to 1. The operation in step S32a serves as, for example, an adjusting module that aims to increase the capability of draining the amount of electric charge from the gate thereof via an off-state holding path, thus decreasing the gate voltage Vge to be close to the clamp voltage $V_{clamp}$. The off-state holding path is defined between the gate and the emitter of the switching element S*# including the off-state holding switching element 50.

Particularly, in step S32a, the voltage correcting unit 58g sets the on resistance of the off-state holding switching element 50 to be higher than the on resistance thereof during the off-state holding task. For example, the voltage correcting unit 58g adjusts the gate voltage, referred to as V1, of the off-state holding switching element 50 in step S32a to be lower than the gate voltage, referred to as V2, thereof during the off-state holding task. This adjustment easily sets the on resistance of the off-state holding switching element 50 to be higher than the on resistance thereof during the off-state holding task.

Figure 18:
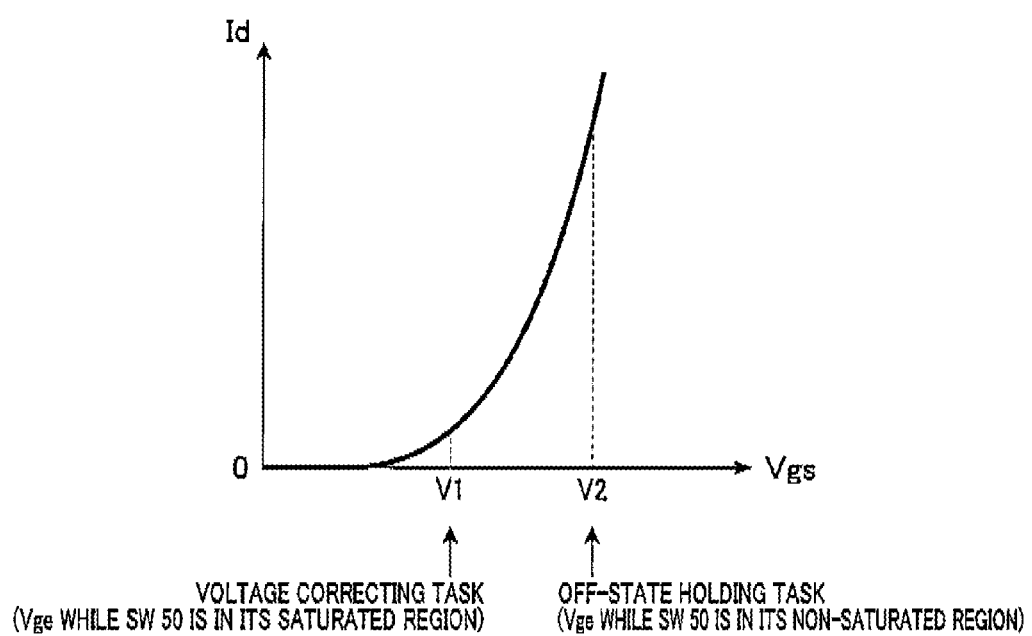
FIG. 18 is a graph schematically illustrating a relationship between the gate voltage and a drain current of the switching element according to the sixth embodiment.

Specifically, in step S32a, the voltage correcting unit 58g sets the gate voltage V1 of the off-state holding switching element 50 in step S32a to a value that drives the off-state holding switching element 50 being in its saturated region in which the drain current is kept substantially constant although the drain-source voltage Vds increases (see FIG. 18). That is, the drain-source voltage Vde while the off-state holding switching element 50 is being driven within its saturated region is higher than that while the off-state holding switching element 50 is being driven within its non-saturated region. For this reason, the on resistance of the off-state holding switching element 50 being driven by the gate voltage V1 is higher than the on resistance thereof being driven by the gate voltage V2. Adjustment of the on resistance of the off-state holding switching element 50 during the voltage correcting task permits adjustment of the amount of electric charge discharged from the gate of the switching element S*#.

Specifically, adjustment of the gate voltage of the off-state holding switching element 50 during the voltage correcting task makes it possible to adjust the amount of electric charge discharged from the gate of the switching element S*#, thus adjusting how the gate voltage Vge is corrected to be close to the clamp voltage $V_{clamp}$.

When the operation in step S32a is completed, the voltage correcting routine proceeds to step S22.

The remaining operations illustrated in FIG. 17 are identical to those illustrated in FIG. 11.

As described above, the drive unit DU for each switching element S*# according to the sixth embodiment is capable of adjusting the amount of electric charge discharged from the gate of the switching element S*# if the voltage-rise magnetic coupling occurs. This makes it possible to desirably adjust how the gate voltage Vge is corrected to be close to the clamp voltage $V_{clamp}$ if the voltage-rise magnetic coupling occurs.

Each of the first to sixth embodiments of the present disclosure can be modified as described hereinafter.

In the first embodiment, upon determination that the gate voltage Vge deviates downwardly from the clamp voltage $V_{clamp}$ (YES in step S18), in order to reduce the impact of the voltage-drop magnetic coupling, the voltage correcting unit 58g carries out the operation in step S20 to turn on the switch 30, and set the completion flag F to 1. This corrects the gate voltage Vge so that it increases. However, the present disclosure is not limited to the configuration. Specifically, in step S18e, the voltage correcting unit 58g can determine whether the gate voltage Vge is equal to or more than the high-side threshold voltage VjdeH. Upon determination that the gate voltage Vge is equal to or more than the high-side threshold voltage VjdeH (YES in step S18e), the voltage correcting unit 58g can determine that the gate voltage Vge deviates upwardly from the clamp voltage $V_{clamp}$. Then, in order to reduce the impact of the voltage-rise magnetic coupling, the voltage correcting unit 58g can carry out the operation in step S32 or S32a to turn on the discharging switching element 38 or the off-state holding switching element 50, and set the completion flag F to 1 (see step S20b). This corrects the gate voltage Vge so that it decreases.

In the third embodiment, the voltage correcting unit 58g is configured to perform both the first voltage correction for the voltage-drop magnetic coupling and the second voltage correction for the voltage-rise magnetic coupling using the terminal T10 and the external signal Sdis. However, the present disclosure is not limited to the configuration. Specifically, the voltage correcting unit 58g can be configured to perform both the first voltage correction for the voltage-drop magnetic coupling and the second voltage correction for the voltage-rise magnetic coupling without using the terminal T10 and the external signal Sdis. In this modification, the voltage correcting unit 58g can perform, based on the gate voltage Vge, the low-side threshold voltage VjdeL, and the high-side threshold voltage VjdeH, both the first voltage correction for the voltage-drop magnetic coupling and the second voltage correction for the voltage-rise magnetic coupling.

In the fourth embodiment, the voltage correcting unit 58g can carry out the operation in step S18f, in place of the operation in step S18b, to determine whether the rate Su of increase of the gate voltage Vge is equal to or higher than a preset rate Sjde2 during execution of the clamping task; the preset rate Sjde2 is greater than zero. The rate Su of increase of the gate voltage Vge represents a future transition of the gate voltage Vge. Thus, the operation in step S18f aims to determine whether the gate voltage Vge deviates upwardly from the clamp voltage $V_{clamp}$.

Specifically, when it is determined that the rate Su of increase of the gate voltage Vge is equal to or higher than the preset rate Sjde2 (YES in step S18f), the voltage correcting unit 58g determines that the gate voltage Vge deviates upwardly from the clamp voltage $V_{clamp}$. Then, in order to reduce the impact of the voltage-rise magnetic coupling, the voltage correcting unit 58g can carry out the operation in step S32 or S32a to turn on the discharging switching element 38 or the off-state holding switching element 50, and set the completion flag F to 1 (see step S20b). This corrects the gate voltage Vge so that it decreases.

In the fifth embodiment, the voltage correcting unit 58g is configured to determine whether the gate voltage Vge deviates downwardly or upwardly from the clamp voltage $V_{clamp}$ using the clamp current $I_{clamp}$, but the present disclosure is not limited thereto. Specifically, the voltage correcting unit 58g can determine whether the gate voltage Vge deviates downwardly or upwardly from the clamp voltage $V_{clamp}$ using the rage of change of the clamp current $I_{clamp}$ during execution of the clamping task. Specifically, in step S18c, when it is determined that the rate of change of the clamp current $I_{clamp}$ during execution of the clamping task is a negative value and the absolute value of the rate of change of the clamp current $I_{clamp}$ is equal to or greater than a preset value, the voltage correcting unit 58g can determine that the gate voltage Vge deviates downwardly from the clamp voltage $V_{clamp}$. In step S18d, when it is determined that the rate of change of the clamp current $I_{clamp}$ during execution of the clamping task is a positive value and the absolute value of the rate of change of the clamp current $I_{clamp}$ is equal to or greater than a preset value, the voltage correcting unit 58g can determine that the gate voltage Vge deviates upwardly from the clamp voltage $V_{clamp}$.

As described above, in step S18e, the voltage correcting unit 58g can determine whether the gate voltage Vge is equal to or more than the high-side threshold voltage VjdeH. Upon determination that the gate voltage Vge is equal to or more than the high-side threshold voltage VjdeH (YES in step S18e), the voltage correcting unit 58g can determine that the gate voltage Vge deviates upwardly from the clamp voltage $V_{clamp}$. Then, in order to reduce the impact of the voltage-rise magnetic coupling, the voltage correcting unit 58g can reduce the constant current flowing through the constant-current switching element 26. Specifically, the switch 30 is set to be in the on state in the normal made of the drive controller 58. Then, as illustrated in FIG. 6, upon determination that the gate voltage Vge is equal to or more than the high-side threshold voltage VjdeH (YES in step S18e), the voltage correcting unit 58g can turn off the switch 30 and set the completion flag F to 1 in step S20b, thus correcting the gate voltage Vge so that it decreases.

In the third embodiment, the voltage correcting unit 58g can discharge electric charge from the gate of the switching element S*# using a soft-turnoff path defined between the gate and the emitter of the switching element S*# including the soft-turnoff resistor 46 and the soft-turnoff switching element 48, thus correcting the gate voltage Vge so that it decreases. For example, in step S32 or 32a, the voltage correcting unit 58g can turn on the soft-turnoff switching element 48, and set the completion flag F to 1. This can increase the capability of draining the amount of electric charge from the gate of the switching element S*# via a soft-turnoff path defined between the gate and the emitter of the switching element S*# including the soft-turnoff resistor 46 and the soft-turnoff switching element 48.

In the third embodiment, the voltage correcting unit 58g can discharge electric charge from the gate of the switching element S*# using a clamping path defined between the gate and the emitter of the switching element S*# including the clamping switching element 40 and the terminal T5, thus correcting the gate voltage Vge so that it decreases. For example, in step S32 or 32a, the voltage correcting unit 58g can change the voltage applied to the inverting input terminal of the second operational amplifier 42 to reduce it by for example, changing the terminal voltage of the first DC power source 44, and set the completion flag F to 1. This can increase the capability of draining the amount of electric charge from the gate of the switching element S*# via the clamping path, thus correcting the gate voltage Vge so that it decreases. Particularly, in step S32, the voltage correcting unit 58g can set the voltage applied to the inverting input terminal of the second operational amplifier 42 to a value equal to or lower than zero. This can maintain the clamping switching element 40 to be continuously in the on state, thus further increasing the capability of draining the amount of electric charge from the gate of the switching element S*# via the clamping path.

As described above, in order to address the voltage-rise magnetic coupling, in step S32 or 32a, the voltage correcting unit 58g can discharge electric charge from the gate of the switching element S*# using at least two of: the off-state holding path, the clamping path, the soft-turnoff path, and the discharging path depending of how the gate voltage Vge deviates upwardly from the clamp voltage $V_{clamp}$.

In the third embodiment, the external signal Sdis has the logical low level associated with the first voltage correction for the voltage-drop magnetic coupling, and the logical high level associated with the second voltage correction for the voltage-rise magnetic coupling, but the present disclosure is not limited thereto. Specifically, the external signal Sdis can have characteristic values, which can be distinguished from each other, linked to the respective first and second voltage corrections, For example, the external signal Sdis can have different frequencies as its characteristic values; the different frequencies are linked to the respective first and second voltage corrections.

In each of the first to sixth embodiments, the clamping switching element 40, the second operational amplifier 42, and the first DC power source 44 serve as a limiting module, but the present disclosure is not limited thereto.

Figure 19:
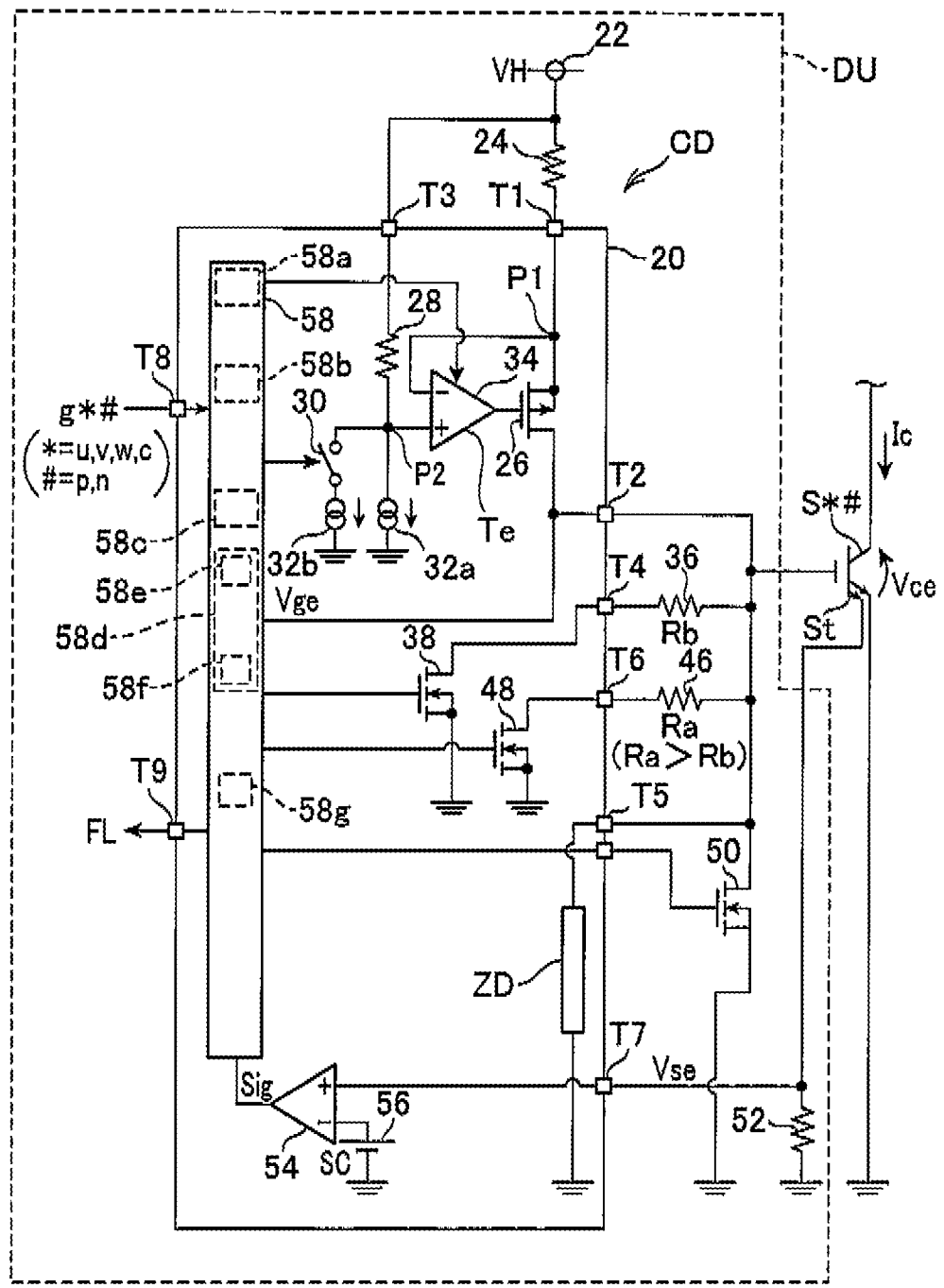
FIG. 19 is a circuit diagram schematically illustrating an example of the structure of each drive unit according to a modification of each of the first to sixth embodiments.

Specifically, referring to FIG. 19, the drive unit DU is comprised of a clamp circuit CC as the limiting module in place of the clamp circuit consisting of the clamping switching element 40, the second operational amplifier 42, and the first DC power source 44. The clamp circuit CC is comprised of series-connected Zener diodes ZD. A first end, i.e. the cathode, of the series-connected Zener diodes ZD is connected to the terminal T5, and a second end, i.e. the anode, thereof is connected to the emitter of the switching element S*# via the common potential line. The series-connected Zener diodes ZD have a breakdown voltage set to be equal to the clamp voltage $V_{clamp}$. The gate of the clamping switching element 42 is connected to the output terminal of the operational amplifier 44.

Specifically, as illustrated in FIG. 19, when the gage voltage Vge reaches the preset voltage Vα, which is set to be lower than the Miller voltage VM, at time t3, the drive controller 54 executes the clamping task. The clamping task turns on the clamping switching element 42, and maintains the clamping switching element 42 in the on state for the clamp-filter time $T_{clamp}$ from the time t3. Specifically, if the gate voltage Vge is lower than the breakdown voltage (clamp voltage $V_{clamp}$), the gate voltage Vge increases. However, if the gate voltage Vge becomes equal to the clamp voltage $V_{clamp}$, the gate voltage Vge is limited to the clamp voltage $V_{clamp}$. In this modification, it is possible to correct the gate voltage Vge to be close to the clamp voltage $V_{clamp}$ if the gate voltage Vge deviates downwardly or upwardly from the clamp voltage $V_{clamp}$.

In each of the first to sixth embodiments, the limiting module is configured to clamp the gate voltage Vge to the clamp voltage $V_{clamp}$ before the gate voltage Vge reaches the upper limit VH, but the present disclosure is not limited thereto. Specifically, the limiting module can be configured to continuously limit the gate voltage Vge to the clamp voltage $V_{clamp}$ for the short-circuit filter time Tsc after the gate voltage Vge exceeds the short-circuit threshold voltage SC.

In each of the first to sixth embodiments, the drive unit DU is configured to charge the gate of the switching element S*# using constant-current control based on the constant-current driving circuit CD, but it can be configured to charge the gate of the switching element S*# using constant-voltage control. For example, in the structure of the drive unit DU illustrated in FIG. 9, the switch 30, the first constant current power supply source 32a, the second constant current power supply source 32b, and the first operational amplifier 34 are eliminated. In this modification, the drive controller 58 is operative to turn on the constant-current switching element 26 while the drive signal g*# is in the on command, and turn off it while the drive signal g*# is in the off command.

In this modification, as the limiting module according to the present disclosure, the clamping switching element 40 and the first power source 44 having the terminal voltage, i.e. the clamp voltage, $V_{clamp}$ and serving as a constant power source can be used without using the second operational amplifier 42; the first power source 44 is connected to the gate of the switching element S*# via the clamping switching element 40. Specifically, in the drive unit DU according to this modification, the voltage-rise magnetic coupling may occur, so that the gate voltage Vge may be deviated upwardly from the clamp voltage $V_{clamp}$. For this reason, in the drive unit DU according to this modification, the voltage correcting structure and function described in either the third embodiment or the sixth embodiment, which increases the capability of draining the amount of electric charge from the gate of the switching element S*#, can be effective in reduction of the gate voltage Vge.

In each of the first to sixth embodiments, the converter CV serves as a DC power source, but the present disclosure is not limited thereto. Specifically, if the converter CV were deactivated or the converter CV were not provided in the hybrid vehicle, the high-voltage battery 12 would serve as the DC power source.

In each of the first to sixth embodiments, the resistor 52, serving as a measuring module, is configured to measure the sense current output from the sense terminal St of the corresponding switching element S*# as the sense voltage Vse, but the present disclosure is not limited thereto. Specifically, the measuring module can be designed as another type of measuring modules capable of measuring a parameter correlated with the sense current flowing through the conductive path between the sense terminal St and the emitter. For example, the measuring module can be equipped with a hall element or other similar sensing devices for measuring a parameter correlated with the sense current flowing through the conductive path between the sense terminal St and the emitter. In this modification, it is preferable that the conductive path has a given level of resistance for preventing a short-circuit between the sense terminal St and the emitter.

In each of the first to sixth embodiments, a single IGBT is used as a switching element S*# of each drive unit DU, but a plurality of IGBTs parallelly connected to each other can be used as a switching elements S*# of each drive unit DU. This modification aims to increase the upper limit of current flowing through the conductive path between the collector and emitter, i.e. the input and output terminals, of the parallelly connected IGBTs. A MOSFET can be used as a switching element S*# of each drive unit DU.

In each of the first to sixth embodiments, the drive units DU are applied to a power converter, such as a converter CV or an inverter IV, installed in motor vehicles, but the present disclosure is not limited to the application. Specifically, the drive units DU can be applied to a power converter for driving another machine, such as a compressor for air-conditioning, and also can be applied to another device except for such power converters.

While illustrative embodiments of the present disclosure have been described herein, the present disclosure is not limited to the embodiment described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A driver for driving a switching element having an input terminal, an output terminal, and an on-off control terminal, the driver comprising:
   a charging module configured to electrically charge the on-off control terminal of the switching element for turning on the switching element;
   a limiting module configured to perform a task of limiting a voltage at the on-off control terminal of the switching element by a predetermined voltage to thereby limit an increase of a current flowing between the input and output terminals of the switching element;
   a determining module configured to determine whether the voltage at the on-off control terminal of the switching element deviates from the predetermined voltage while the limiting module is performing the limiting task; and
   a correcting module configured to correct the voltage at the on-off control terminal of the switching element to be close to the predetermined voltage when it is determined that the voltage at the on-off control terminal of the switching element deviates from the predetermined voltage.

2. The driver according to claim 1, wherein the determining module is configured to detect that the voltage at the on-off control terminal of the switching element is different from the predetermined voltage by a preset value while the limiting module is performing the limiting task to thereby determine that the voltage at the on-off control terminal of the switching element deviates from the predetermined voltage.

3. The driver according to claim 1, wherein the determining module is configured to detect that an absolute value of a rate of change of the voltage at the on-off control terminal of the switching element becomes equal to or higher than a preset rate greater than zero while the limiting module is performing the limiting task to thereby determine that the voltage at the on-off control terminal of the switching element deviates from the predetermined voltage.

4. The driver according to claim 1, wherein the limiting module is provided in an electrical path connecting between the on-off control terminal and the output terminal of the switching element, and the determining module is configured to determine, based on change in a current flowing through the electrical path, whether the voltage at the on-off control terminal of the switching element deviates from the predetermined voltage while the limiting module is performing the limiting task.

5. The driver according to claim 1, further comprising:
   a measuring module configured to measure a value of a parameter correlated with the current flowing between the input and output terminals of the switching element;
   a current determining module configured to determine whether a level of the current flowing between the input and output terminals of the switching element has exceeded a preset current level for a threshold time based on the value of the parameter measured by the measuring module; and
   a forced-turnoff module configured to forcibly turn off the switching element when it is determined that the level of the current flowing between the input and output terminals of the switching element has exceeded the preset current level for the threshold time.

6. The driver according to claim 1, wherein, when it is determined that the voltage at the on-off control terminal of the switching element deviates downwardly from the predetermined voltage, the correcting module is configured to increase an amount of electric charge charged by the charging module in the on-off control terminal of the switching element, thus correcting the voltage at the on-off control terminal of the switching element.

7. The driver according to claim 6, wherein:
   the charging module includes a constant-current module configured to supply a constant current to the on-off control terminal of the switching element to thereby charge the on-off control terminal of the switching element for turning on the switching element, and
   the correcting module is configured to increase a level of the constant current, thus correcting the voltage at the on-off control terminal of the switching element.

8. The driver according to claim 1, wherein, when it is determined that the voltage at the on-off control terminal of the switching element deviates upwardly from the predetermined voltage, the correcting module is configured to increase an amount of electric charge discharged from the on-off control terminal of the switching element, thus correcting the voltage at the on-off control terminal of the switching element.

9. The driver according to claim 8, further comprising:
   a normal discharging path connected to the on-off control terminal of the switching element, the normal discharging path being used for turning off the switching element while the switching element is normally operating,
   wherein the correcting module is configured to discharge electric charge, charged by the charging module in the on-off control terminal of the switching element, from the on-off control terminal thereof, thus correcting the voltage at the on-off control terminal of the switching element.

10. The driver according to claim 8, further comprising:
    a normal discharging path connected to the on-off control terminal of the switching element, the normal discharging path being used for turning off the switching element while the switching element is normally operating;

an off-state holding path short-circuiting between the output terminal of the switching element and the on-off control terminal; and an off-state holding switching element having an on-off control terminal and provided in the off-state holding path for opening or closing the off-state holding path, wherein the correcting module further comprises an adjusting module configured to adjust a voltage at the on-off control terminal of the off-state holding switching element to adjust an on resistance of the off-state holding switching element, the correcting module being configured to discharge electric charge, charged by the charging module in the on-off control terminal of the switching element, from the on-off control terminal thereof while adjusting the on resistance of the off-state holding switching element by the adjusting module, thus correcting the voltage at the on-off control terminal of the switching element.

11. The driver according to claim 1, wherein the correcting module is configured to perform:
a first voltage correction to increase an amount of electric charge charged by the charging module in the on-off control terminal of the switching element when it is determined that the voltage at the on-off control terminal of the switching element deviates downwardly from the predetermined voltage; and
a second voltage correction to increase the amount of the electric charge, charged in the on-off control terminal of the switching element, discharged from the on-off control terminal thereof when it is determined that the voltage at the on-off control terminal of the switching element deviates upwardly from the predetermined voltage,
the driver further comprising an input module to which an external signal is input, the external signal representing which of the first voltage correction and the second voltage correction should be performed,
the correcting module being configured to determine one of the first voltage correction and the second voltage correction to be performed according to the external signal.

12. The driver according to claim 1, wherein the correcting module comprises:
an electrical path connecting between the on-off control terminal and the output terminal of the switching element;
a power source having the predetermined voltage as a terminal voltage thereof, and having positive and negative terminals, the negative terminal being connected to the output terminal of the switching element;
a clamping switching element provided in the electrical path and having an open-close control terminal; and
an operational amplifier having a non-inverting input terminal, an inverting input terminal, and an output terminal, the non-inverting input terminal being connected to a connection point between the on-off control terminal and the clamping switching element, the inverting input terminal being connected to the positive terminal of the power source, the output terminal being connected to the on-off control terminal of the clamping switching element.

13. The driver according to claim 1, wherein the limiting module is configured to, as the limiting task, limit the voltage at the on-off control terminal of the switching element by the predetermined voltage for a preset time before the voltage at the on-off control terminal of the switching element reaches an upper limit thereof.

14. The driver according to claim 1, wherein the switching element is a switching member comprised of series-connected high-side and low-side switching elements, and the switching member is connected to a DC power source.

15. A control system for controlling a machine, the control system comprising:
an inverter equipped with a pair of upper- and lower-arm switching elements connected in series, each of the upper- and lower-arm switching elements having an input terminal, an output terminal, and an on-off control terminal; and
a driver for driving each of the upper- and lower-arm switching elements to thereby invert a DC voltage inputted to the inverter into an AC voltage to be supplied to the machine, the driver comprising:
a charging module configured to charge the on-off control terminal of a corresponding one of the upper- and lower switching elements for turning on the corresponding one of the upper- and lower switching elements;
a limiting module configured to perform a task of limiting a voltage at the on-off control terminal of a corresponding one of the upper- and lower switching elements by a predetermined voltage to thereby limit an increase of a current flowing between the input and output terminals of a corresponding one of the upper- and lower switching elements;
a determining module configured to determine whether the voltage at the on-off control terminal of a corresponding one of the upper- and lower switching elements deviates from the predetermined voltage while the limiting module is performing the limiting task; and
a correcting module configured to correct the voltage at the on-off control terminal of a corresponding one of the upper- and lower switching elements to be close to the predetermined voltage when it is determined that the voltage at the on-off control terminal of a corresponding one of the upper- and lower switching elements deviates from the predetermined voltage.

* * * * *